United States Patent
Tuers et al.

(10) Patent No.: US 9,720,612 B2
(45) Date of Patent: Aug. 1, 2017

(54) BIASING SCHEMES FOR STORAGE OF BITS IN UNRELIABLE STORAGE LOCATIONS

(71) Applicant: SanDisk Technologies Inc., Plano, TX (US)

(72) Inventors: Daniel Tuers, Kapaa, HI (US); Abhijeet Manohar, Bangalore (IN); Jonathan Hsu, Newark, CA (US)

(73) Assignee: SanDisk Technologies LLC, Plano, TX (US)

( * ) Notice: Subject to any disclaimer, the term of this patent is extended or adjusted under 35 U.S.C. 154(b) by 79 days.

(21) Appl. No.: 14/700,950

(22) Filed: Apr. 30, 2015

(65) Prior Publication Data

US 2016/0321000 A1  Nov. 3, 2016

(51) Int. Cl.

| | |
|---|---|
| *G06F 12/00* | (2006.01) |
| *G06F 3/06* | (2006.01) |
| *G06F 12/14* | (2006.01) |
| *G06F 11/10* | (2006.01) |
| *G11C 29/00* | (2006.01) |
| *G11C 16/34* | (2006.01) |
| *G11C 29/42* | (2006.01) |
| *G11C 29/44* | (2006.01) |
| *G11C 29/52* | (2006.01) |
| *G11C 16/10* | (2006.01) |
| *G11C 29/04* | (2006.01) |

(52) U.S. Cl.
CPC .......... *G06F 3/0629* (2013.01); *G06F 3/0623* (2013.01); *G06F 3/0679* (2013.01); *G06F 11/1004* (2013.01); *G06F 12/1408* (2013.01); *G11C 16/3418* (2013.01); *G11C 29/42* (2013.01); *G11C 29/44* (2013.01); *G11C 29/52* (2013.01); *G11C 29/70* (2013.01); *G11C 29/82* (2013.01); *G06F 3/0619* (2013.01); *G06F 2212/402* (2013.01); *G11C 16/10* (2013.01); *G11C 2029/0409* (2013.01)

(58) Field of Classification Search
None
See application file for complete search history.

(56) References Cited

U.S. PATENT DOCUMENTS

| | | |
|---|---|---|
| 7,805,662 B2 | 9/2010 | Ma et al. |
| 7,814,401 B2 | 10/2010 | Alrod et al. |
| 8,301,912 B2 | 10/2012 | Lin et al. |
| 8,675,417 B2 | 3/2014 | Litsyn et al. |
| 8,885,428 B2 | 11/2014 | Chen et al. |
| 2006/0023507 A1 | 2/2006 | Mangan et al. |

(Continued)

*Primary Examiner* — Baboucarr Faal
(74) *Attorney, Agent, or Firm* — Brinks Gilson & Lione

(57) ABSTRACT

A controller of a non-volatile memory system may be configured to identify bits of data to be stored in memory elements of non-volatile memory that are identified as unreliable. The controller may be configured to bias at least some of these bits to a predetermined logic value at which the bits are likely to be read from the unreliable memory elements. The controller may do so using a biasing key that the controller generates based on identification of the bits. Subsequently, when the data is read, the controller may assign log likelihood ratio values for the bits to correspond to a percent likelihood of the bits being biased to the predetermined logic value. The bits may also be unbiased using the biasing key.

27 Claims, 12 Drawing Sheets

(56) References Cited

U.S. PATENT DOCUMENTS

| | | | |
|---|---|---|---|
| 2007/0089044 A1* | 4/2007 | Goma | H03M 13/19 |
| | | | 714/801 |
| 2012/0260148 A1* | 10/2012 | Hughes | G06F 11/1068 |
| | | | 714/773 |
| 2014/0126293 A1 | 5/2014 | Tsai et al. | |
| 2014/0133234 A1 | 5/2014 | Conley et al. | |
| 2014/0157087 A1 | 6/2014 | Yurzola et al. | |
| 2014/0219023 A1 | 8/2014 | Li et al. | |
| 2014/0250348 A1 | 9/2014 | Harari et al. | |
| 2014/0269071 A1 | 9/2014 | Pandya et al. | |
| 2015/0046770 A1 | 2/2015 | Luo et al. | |
| 2016/0322990 A1* | 11/2016 | Tuers | H03M 13/45 |

\* cited by examiner

BIASING SCHEMES FOR STORAGE OF BITS IN UNRELIABLE STORAGE LOCATIONS

BACKGROUND

Memory systems may have memory elements that store data unreliably. Some of the unreliable memory elements may be unreliable in that they exhibit a high likelihood of returning data at the same logic value regardless of the logic value at which the data was actually programmed. For example, when a controller reads a data bit from an unreliable memory element, the unreliable memory element may, with high frequency, return the data bit as a logic 1 value regardless of whether that data bit was programmed into the unreliable memory element as a logic 1 or logic 0 value.

Before data is programmed into memory, the data may be randomized, which may result in a generally equal distribution of logic 1 and logic 0 data bits programmed in the memory. Statistically, then, the odds that a logic 1 data bit or a logic 0 data bit are to be stored in an unreliable memory element is about the same—50%. As a result, for unreliable memory elements that return the same logic value with high frequency, there is statistically about a 50% chance that data is read from unreliable memory elements correctly.

Although avoiding programming data into unreliable elements may be an effective way to reduce errors when subsequently reading the data, doing so limits the amount of memory elements that may be utilized to store data. In order to utilize as much storage space as possible, it may be desirable to store data in unreliable memory cells, but to do so in a way that increases the odds of the data being read to above 50%.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF PRESENTLY PREFERRED EMBODIMENTS

Overview

Figure 1A:
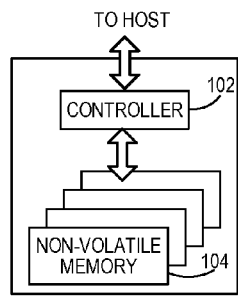
FIG. 1A is a block diagram of an exemplary non-volatile memory system.

By way of introduction, the below embodiments relate to memory systems and methods for encoding and decoding data that includes bits stored in memory elements identified as unreliable. In one embodiment, a non-volatile memory system may include non-volatile memory, an unreliable storage location identifier module, a biasing module, and a biasing key generator module. The unreliable storage location identifier module may be configured to identify a plurality of memory elements of the non-volatile memory to store data, and determine which memory elements of the plurality of memory elements are identified in the non-volatile memory system as unreliable. The biasing module may be configured to bias bits of the data to be stored in the identified unreliable memory elements to a predetermined logic value using a biasing key. The biasing key generator module may be configured to assign bit values for the biasing key in order for the biasing module to bias, using the biasing key, more than 50% of the bits to be stored in the identified unreliable memory elements to the predetermined logic value.

In a second embodiment, a method of generating encoded data to be stored in non-volatile memory of a non-volatile memory system may be performed. The method may include scrambling, with at least one of an encryption engine or a scrambling module, a first set of bits of data to be stored in first memory elements of non-volatile memory, where the first memory elements are identified in the non-volatile memory system as reliable. The method may further include biasing, with a biasing module using a biasing key, a second set of bits of the data to be stored in second memory elements of the non-volatile memory to a predetermined logic value, where the second memory elements are identified in the non-volatile memory system as unreliable. In addition, the method may include generating, with an encoding module, parity bits for the scrambled first set of bits and the biased second set of bits to form the encoded data, and transferring, with a memory interface, the encoded data to the non-volatile memory for storage.

In a third embodiment, a non-volatile memory system may include non-volatile memory and a controller. The controller may include a plurality of write modules to write data into the non-volatile memory and a plurality of read modules to read the data from the non-volatile memory. The plurality of write modules may include a biasing module configured to bias, to a predetermined logic value using a biasing key, bits of the data to be stored in memory elements of the non-volatile memory identified as unreliable. The plurality of read modules may include a log likelihood ratio module configured to assign log likelihood ratio values for the biased bits stored in the identified unreliable memory elements. The log likelihood ratio values assigned to the biased bits may correspond to a percent likelihood that a respective one of the biased bits was biased to the predetermined value using the biasing key. The plurality of read modules may further include a decode module configured to decode the data based on the assigned logic likelihood ratio values.

In some embodiments, the biasing key generator module may be further configured to group the bits into a plurality of bit groups, where each bit group corresponds to a bit of the biasing key. The biasing key generator module may also be configured to select logic values from the plurality of bit groups, and assign the bit values for the biasing key based on the selected logic values from the plurality of bit groups.

In some embodiments, the non-volatile memory system may further include a scrambling module configured to scramble bits of data to be stored in memory elements identified as reliable without scrambling bits to be stored in memory elements identified as unreliable.

In some embodiments, the plurality of write modules may be configured to write other bits of data to memory elements identified as reliable without being biased by the biasing module. The log likelihood ratio module may further configured to receive a plurality of bit representations associated with the biased bits and the unbiased bits, and determine whether each of the plurality of bit representations is associated with one of the biased bits or one of the unbiased bits. When a bit representation is determined to be associated with one of the unbiased bits, the log likelihood ratio module may be configured to assign a log likelihood ratio value for the one of the unbiased bits based on a value of the associated bit representation.

In some embodiments, the log likelihood ratio module may be further configured to lock the log likelihood ratio values when the percent likelihood is a one-hundred percent likelihood, and unlock the log likelihood ratio values when the percent likelihood is less than a one-hundred percent likelihood.

Other embodiments are possible, and each of the embodiments can be used alone or together in combination. Accordingly, various embodiments will not be described with reference to the attached drawings.

Exemplary Embodiments

The following embodiments describe non-volatile memory systems and related methods for encoding and decoding data that includes bits stored in memory elements identified as unreliable. Before turning to these and other embodiments, the following paragraphs provide a discussion of exemplary non-volatile memory systems and storage modules that can be used with these embodiments. Of course, these are just examples, and other suitable types of non-volatile memory systems and/or storage modules can be used.

FIG. 1A is a block diagram illustrating a non-volatile memory system 100. The non-volatile memory system 100 may include a controller 102 and non-volatile memory that may be made up of one or more non-volatile memory dies 104. As used herein, the term die refers to the set of non-volatile memory cells, and associated circuitry for managing the physical operation of those non-volatile memory cells, that are formed on a single semiconductor substrate. The controller 102 may interface with a host system and transmit command sequences for read, program, and erase operations to the non-volatile memory die 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable flash interface, such as Toggle Mode 200, 400, or 800. In one embodiment, the memory system 100 may be a card based system, such as a secure digital (SD) or a micro secure digital (micro-SD) card. In an alternate embodiment, the system 100 may be part of an embedded memory system.

Although in the example illustrated in FIG. 1A, the non-volatile memory system 100 may include a single channel between the controller 102 and the non-volatile memory die(s) 104, the subject matter described herein is not limited to having a single memory channel. For example, in some NAND memory system architectures, 2, 4, 8 or more NAND channels may exist between the controller and the NAND memory die(s) 104, depending on controller capabilities. In any of the embodiments described herein, more than a single channel may exist between the controller and the memory die(s) 104, even if a single channel is shown in the drawings.

Figure 1B:
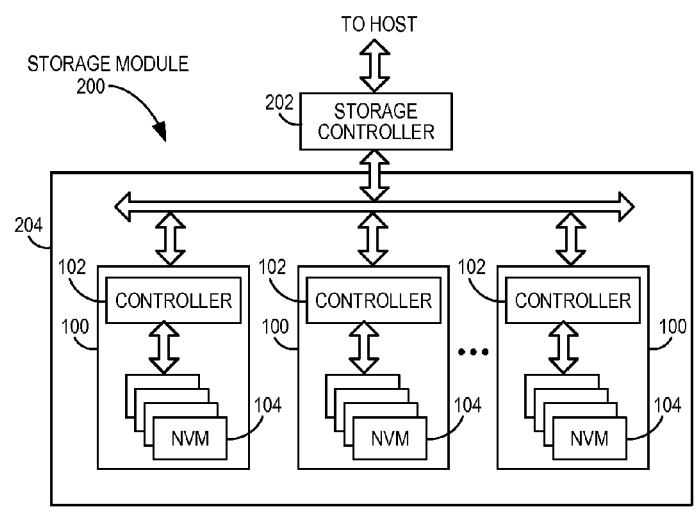
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage system 200, in one embodiment, may be a solid state drive (SSD), such as found in portable computing devices, such as laptop computers and tablet computers, and mobile phones.

Figure 1C:
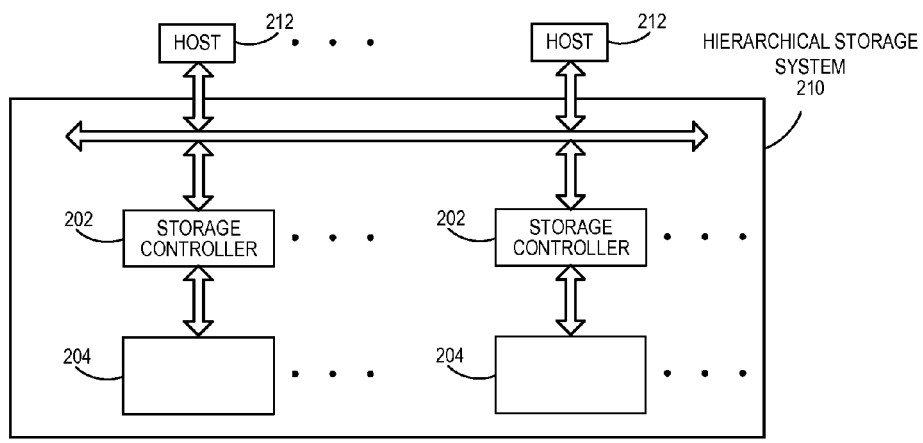
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
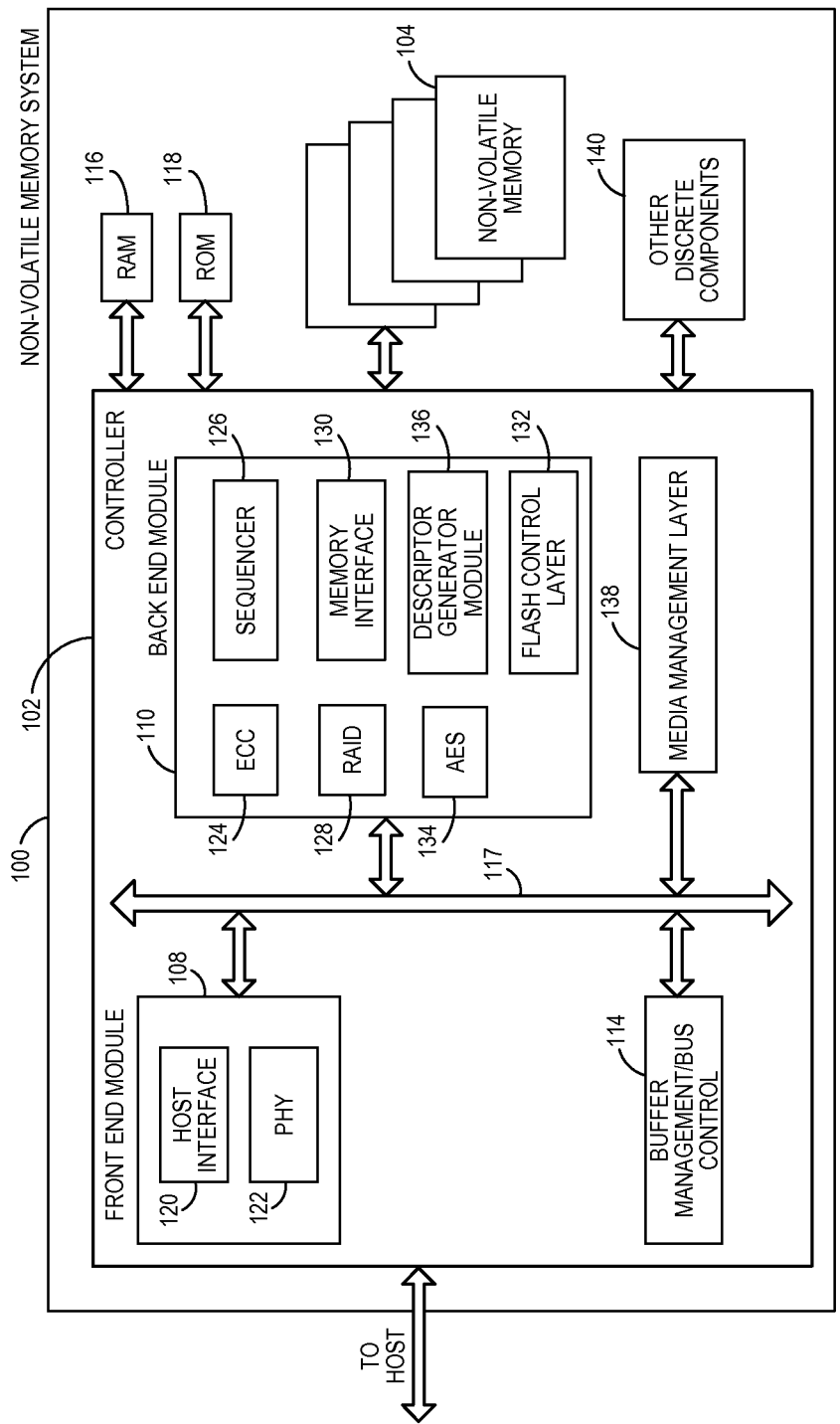
FIG. 2A is a block diagram of exemplary components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Examples types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction controller (ECC) engine 124 that encodes the data bytes received from the host, and decodes and error corrects the data bytes read from the non-volatile memory 104. Further functionality of the ECC engine 124 is described in further detail below. The back end module 110 may also include a command sequencer 126 that generates command sequences, such as program, read, and erase command sequences, to be transmitted to the non-volatile memory die 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. The back end module 110 may also include an encryption engine 134, such as an Advanced Encryption Standard (AES) engine, that generates and outputs an encrypted version of the data. Due to the nature of the encryption, the encrypted data may be in a scrambled format of randomly distributed logic 1 and logic 0 values.

In addition, the back end module 110 may include a descriptor generator module 136 that is configured to generate descriptors at least for the encoding and decoding performed by the ECC engine 124. As described in further detail below, when data is to be written to the non-volatile memory dies 104, such as in response to a host write request, the descriptor generator module 136 may generate a descriptor associated with the data and provide the descriptor to the ECC engine 124. In response to receipt of the descriptor, the ECC engine 124 may retrieve the data, which may be stored in RAM 116, and encode the data prior to it being written to the non-volatile memory dies 104. In addition, when data is read from the non-volatile memory dies 104, such as in response to a host read request, the descriptor generator module 136 may generate a descriptor associated with the data and provide the descriptor to the ECC engine 124. In response to receipt of the descriptor, the ECC engine 124 may retrieve the data, which may be stored in RAM 116, and decode the data prior to it being sent to its final destination, such as to the host.

A memory interface 130 may provide the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface, such as a Toggle Mode 200, 400, or 800 interface. A flash control layer 132 may control the overall operation of back end module 110.

Additional modules of the non-volatile memory system 100 illustrated in FIG. 2A may include a media management layer 138, which performs wear leveling of memory cells of the non-volatile memory die(s) 104. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Figure 2B:
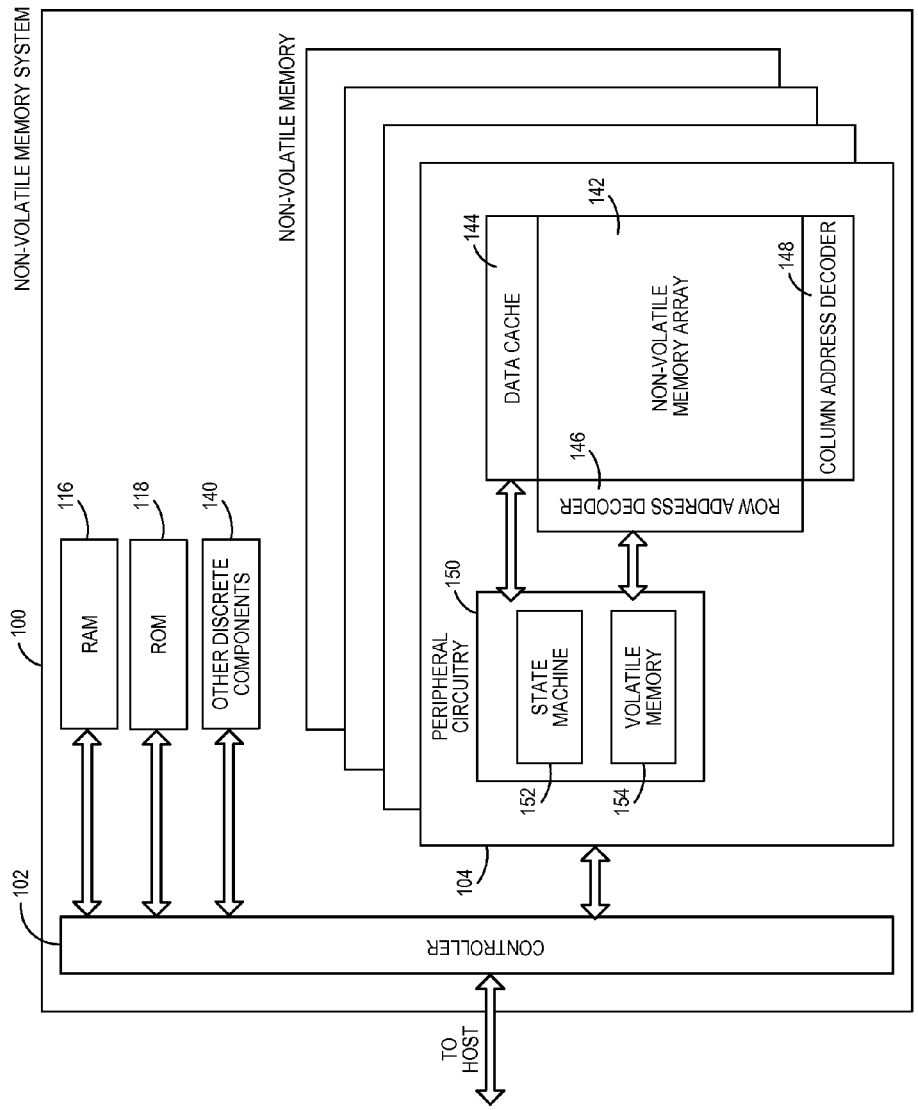
FIG. 2B is a block diagram of exemplary components of a non-volatile memory die of the non-volatile memory system of FIG. 1A.

FIG. 2B is a block diagram illustrating exemplary components of a non-volatile memory die 104 in more detail. The non-volatile memory die 104 may include a non-volatile memory array 142. The non-volatile memory array 142 may include a plurality of non-volatile memory elements or cells, each configured to store one or more bits of data. The non-volatile memory elements or cells may be any suitable non-volatile memory cells, including NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable. In addition, the memory elements or cells may be configured as single-level cells (SLCs) that store a single bit of data per cell, multi-level cells (MLCs) that store multiple bits of data per cell, or combinations thereof. For some example configurations, the multi-level cells (MLCs) may include triple-level cells (TLCs) that store three bits of data per cell.

Additionally, a flash memory cell may include in the array 142 a floating gate transistor (FGT) that has a floating gate and a control gate. The floating gate is surrounded by an insulator or insulating material that helps retain charge in the floating gate. The presence or absence of charges inside the floating gate may cause a shift in a threshold voltage of the FGT, which is used to distinguish logic levels. That is, each FGT's threshold voltage may be indicative of the data stored in the memory cell. Hereafter, FGT, memory element and memory cell may be used interchangeably to refer to the same physical entity.

The memory cells may be disposed in the memory array 142 in accordance with a matrix-like structure of rows and columns of memory cells. At the intersection of a row and a column is a FGT (or memory cell). A column of FGTs may be referred to as a string. FGTs in a string or column may be electrically connected in series. A row of FGTs may be referred to as a page. Control gates of FGTs in a page or row may be electrically connected together.

The memory array 142 may also include wordlines and bitlines connected to the FGTs. Each page of FGTs is coupled to a wordline. In particular, each wordline may be coupled to the control gates of FGTs in a page. In addition, each string of FGTs may be coupled to a bitline. Further, a single string may span across multiple wordlines, and the number of FGTs in a string may be equal to the number of pages in a block.

Figure 3:
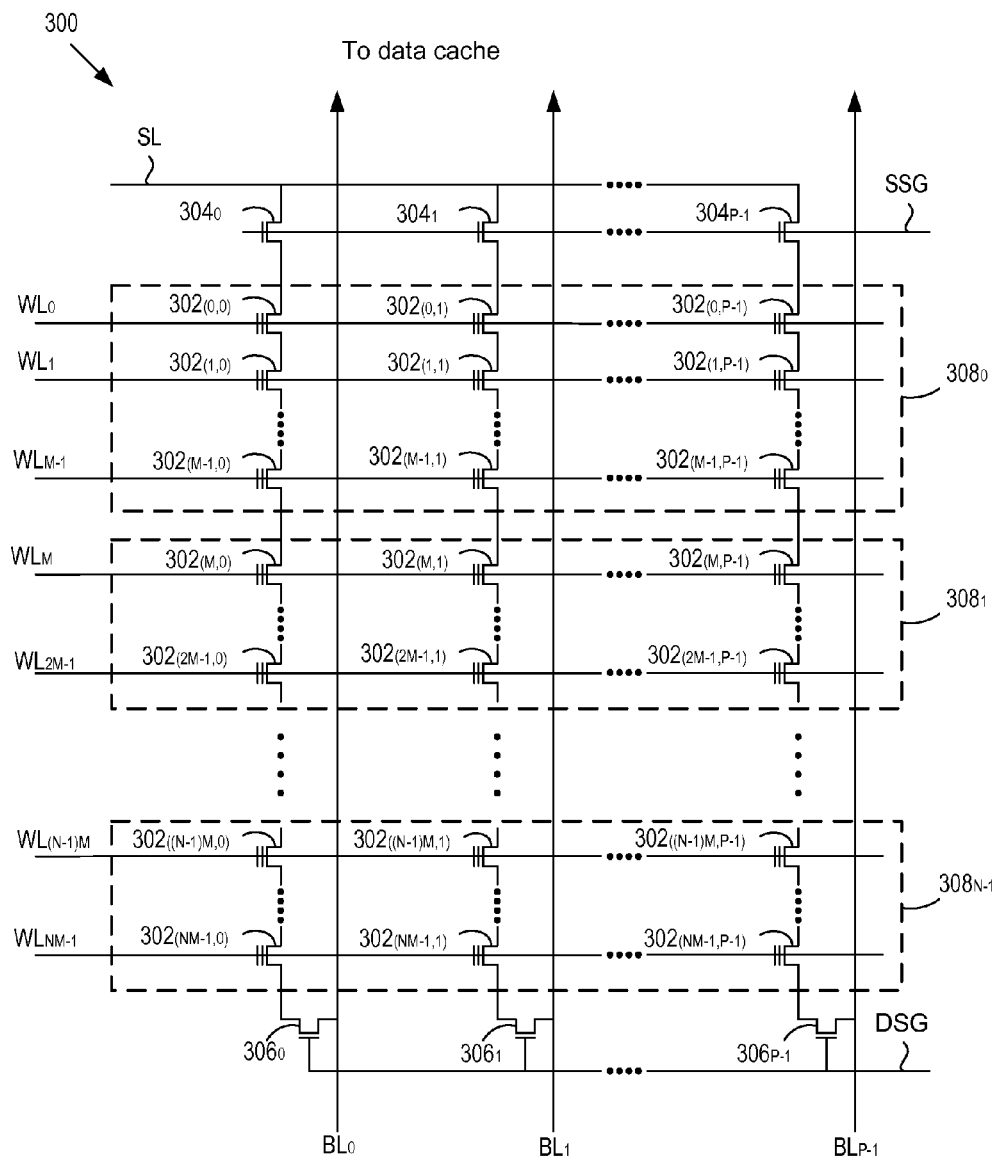
FIG. 3 is a circuit schematic diagram of at least a portion of an exemplary NAND-type flash memory array.

FIG. 3 is a circuit schematic diagram of at least a portion of an exemplary NAND-type flash memory array 300, which may be representative of at least a portion of the memory array 142. The memory array portion 300 may include a P-number of series-connected strings of (N times M) FGTs, each coupled to one of a P-number of bitlines $BL_0$ to $BL_{P-1}$, where N is the number of blocks $308_0$ to $308_{N-1}$ in the memory array 300, and M is the number of pages of FGTs coupled to wordlines WL in each of the N-number of blocks $308_0$ to $308_{N-1}$.

To sense data from the FGTs, a page of FGTs and a corresponding wordline may be selected, and current sensing of bitlines may be employed to determine whether a floating gate of a FGT in the selected page contains charge or not. Current that flows through a string may flow from a source line SL, through the string, to a bitline BL to which the string is coupled. The string may be coupled to the source line SL via a source select transistor, and may be coupled to its associated bitline BL via a drain select transistor. For example, a first string of FGTs $302_{(0,0)}$ to $302_{(NM-1,0)}$ may be coupled to the source line SL via a source select transistor $304_0$ that is connected to the source line SL, and may be coupled to its associated bitline $BL_0$ via a drain select transistor $306_0$. The other strings may be similarly coupled. Switching of source select transistors $304_0$, $304_1$, ..., $304_{P-1}$ may be controlled using a source select gate bias line SSG that supplies a source select gate bias voltage $V_{SSG}$ to turn on an off the source select transistors $304_0$, $304_1$, ..., $304_{P-1}$. Additionally, switching of drain select transistors $306_0$, $306_1$, ..., $306_{P-1}$ may be controlled using a drain select gate bias line DSG that supplies a drain select gate bias voltage $V_{DSG}$ to turn on and off the drain select transistors $306_0$, $306_1$, ..., $306_{P-1}$.

Referring back to FIG. 2B, the non-volatile memory die 104 may further include a page buffer or data cache 144 that caches data that is sensed from and/or that is to be programmed into the memory array 142. The non-volatile memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

In addition, the non-volatile memory die 104 may include peripheral circuitry 150. The peripheral circuitry 150 may include a state machine 152 that provides status information to the controller 102. The peripheral circuitry 150 may also include volatile memory 154. An example configuration of the volatile memory 154 may include latches, although other configurations are possible.

Figure 4:
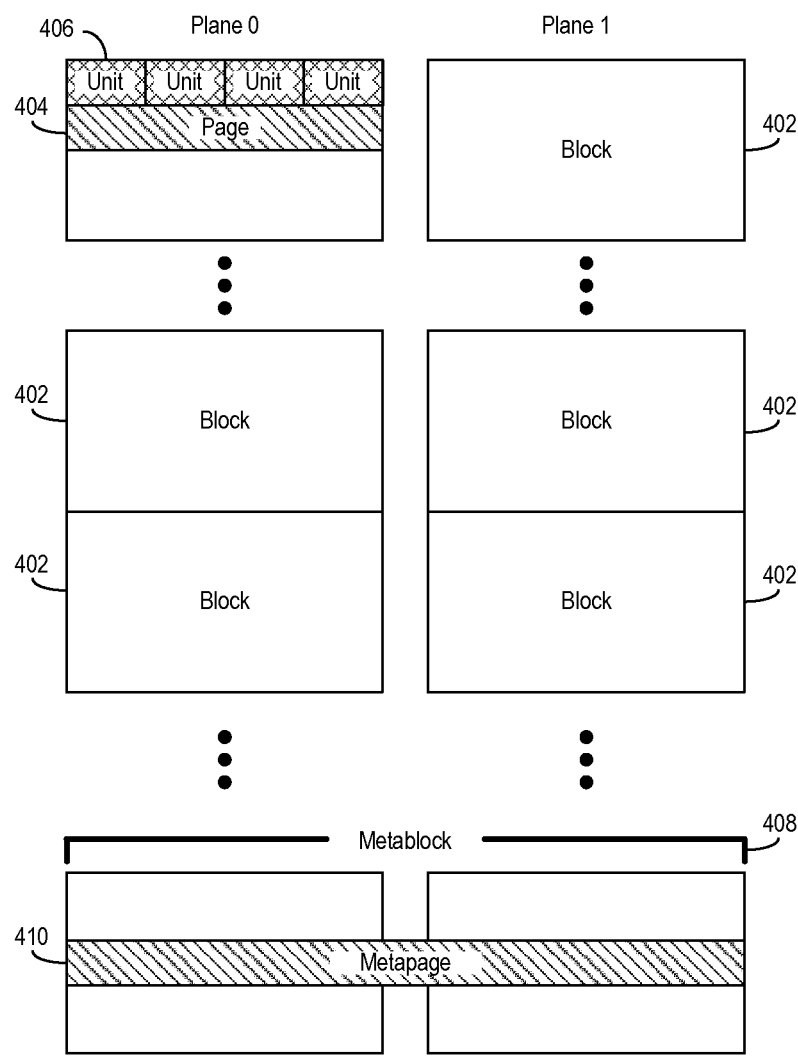
FIG. 4 is a block diagram of an example organizational arrangement or hierarchy of a memory array for flash memory.

Referring to FIG. 4, the memory array 142 and/or a plurality of memory arrays 142 spanning multiple memory dies 104 may have an organizational arrangement or hierarchy under which memory elements or cells of the memory array 142 and/or multiple memory arrays 142 of multiple memory dies 104 may be organized. The controller 102 may be configured to store and access data in accordance with the organizational arrangement or hierarchy.

FIG. 4 is a block diagram of an example organizational arrangement or hierarchy of a memory array 142 for flash memory. As mentioned, for flash memory, the memory cells may be divided or organized into blocks 402, and each block 402 may further be divided into a number of pages 404. Each block 402 may contain the minimum number of memory elements that may be erased together. In addition, each page 404 may be a unit of sensing in the memory array 142. Each individual page 404 may further be divided into segments or units 406, with each segment or unit 406 containing the fewest number of memory cells that may be written to at one time as a basic programming operation. Data stored in a segment or unit of memory cells—referred to as a flash memory unit (FMU), an ECC page, or a codeword—may contain the amount of data that is written at one time during a basic programming operation and/or the amount of data that can be encoded or decoded by the ECC engine 124 during a single encoding or decoding operation. For some example configurations, the pages 404 may be divided into the same number of segments or units 406. Example numbers of segments or unit may be four or eight, although other numbers are possible. In general, data may be stored in blocks and pages of memory elements non-contiguously (randomly) or contiguously.

In addition, the organizational arrangement or hierarchy may include one or more planes in which each of the blocks 402 may be configured. Generally, a plane includes a "column" of blocks 402, although other configurations may be possible. A single memory array 142 may include a single plane or multiple planes. The example arrangement shown in FIG. 4 includes two planes, Plane 0 and Plane 1. Data stored in different planes may be sensed simultaneously or independently.

Additionally, the organizational arrangement or hierarchy may include metablocks 408 and metapages 410. A metablock address or number identifying a metablock may be mapped to and/or correspond to a logical address (e.g., a logical group number) provided by a host. A metablock 408 and a metapage 410 may span or be distributed across a respective single block and page in a single plane, or alternatively, may span or be distributed across respective multiple blocks and multiple pages across multiple planes. FIG. 4 shows the metablock 408 and the metapage 410 spanning across two planes, Plane 0 and Plane 1. Depending on the organizational arrangement, metablocks 408 and metapages 410 spanning across multiple planes may span across only those planes of a single memory die 104, or alternatively may span across multiple planes of multiple memory dies 104.

Referring back to FIG. 3, for some example configurations, the organizational arrangement or hierarchy may also group the bitlines (BL) into groups (otherwise referred to as columns) of bitlines (BL). Grouping the bitlines may reduce the complexity of addressing the storage locations of the array in that a column address over a page may be identified on the basis of groups (or columns) of bitlines, rather than on a bitline-by-bitline basis. In one example, a block 308 may include 16,000 bitlines (i.e., P=16,000), and every sixteen bitlines BL may be grouped together in a group (or column). Grouping the 16,000 bitlines BLs into groups or columns of sixteen may yield only 1,000 column addresses over a page, rather than 16,000 column addresses. Various ways of grouping the bitlines BL into bitline groups may be possible.

At some point during the lifetime of the non-volatile memory system 100, some of the memory elements of an array may store data unreliably. These memory elements may store data unreliably for various reasons, such as due to open circuits, closed circuits, short circuits, endurance or retention issues (e.g., a memory element has exceeded a certain threshold number of program/erase cycles), or as a result of program disturb (when a bit is programmed into a memory element and then later, a neighboring memory element (from the same wordline or an adjacent wordline) is programmed at a higher state, causing the first memory element to be programmed at a slightly higher state). Whatever the reason, memory elements may be or become unreliable, and as a result may not reliably return data at the logic values at which the data was programmed.

For purposes of the present description, the term "bad" may be used interchangeably with "unreliable." Accordingly, the term "bad" may be used in conjunction with various storage locations or components of an array (e.g., memory elements, bit lines, bitline groups, or other groupings or zones of memory elements) to indicate those storage locations or components as unreliable and/or that are at least identified in the non-volatile memory system 100 as being unreliable. Similarly, the term "good" may be used to refer to reliable storage locations or components and/or that are identified in the non-volatile memory system 100 as being reliable. In addition, the terms "bad" and "good" may be used in conjunction with data (including bits of data) to indicate that the data is to be stored or is being stored in reliable and unreliable storage locations, respectively.

As previously mentioned, some unreliable memory elements may return data at the same logic value regardless of whether the data was originally programmed as a logic 1 value or a logic 0 value. Assuming that data has a generally even distribution of logic 1 and logic 0 values when stored in a non-volatile memory die 104, there is about a 50% chance that data stored in unreliable memory elements will be returned correctly or as expected (i.e., be at logic values that match the logic values at which they were originally programmed). The following describes example encoding and decoding processes that encode and decode data stored in memory elements that are identified by the controller 102 as being unreliable in a way that increases the odds that the data will be read back correctly to above 50%.

Figure 5:
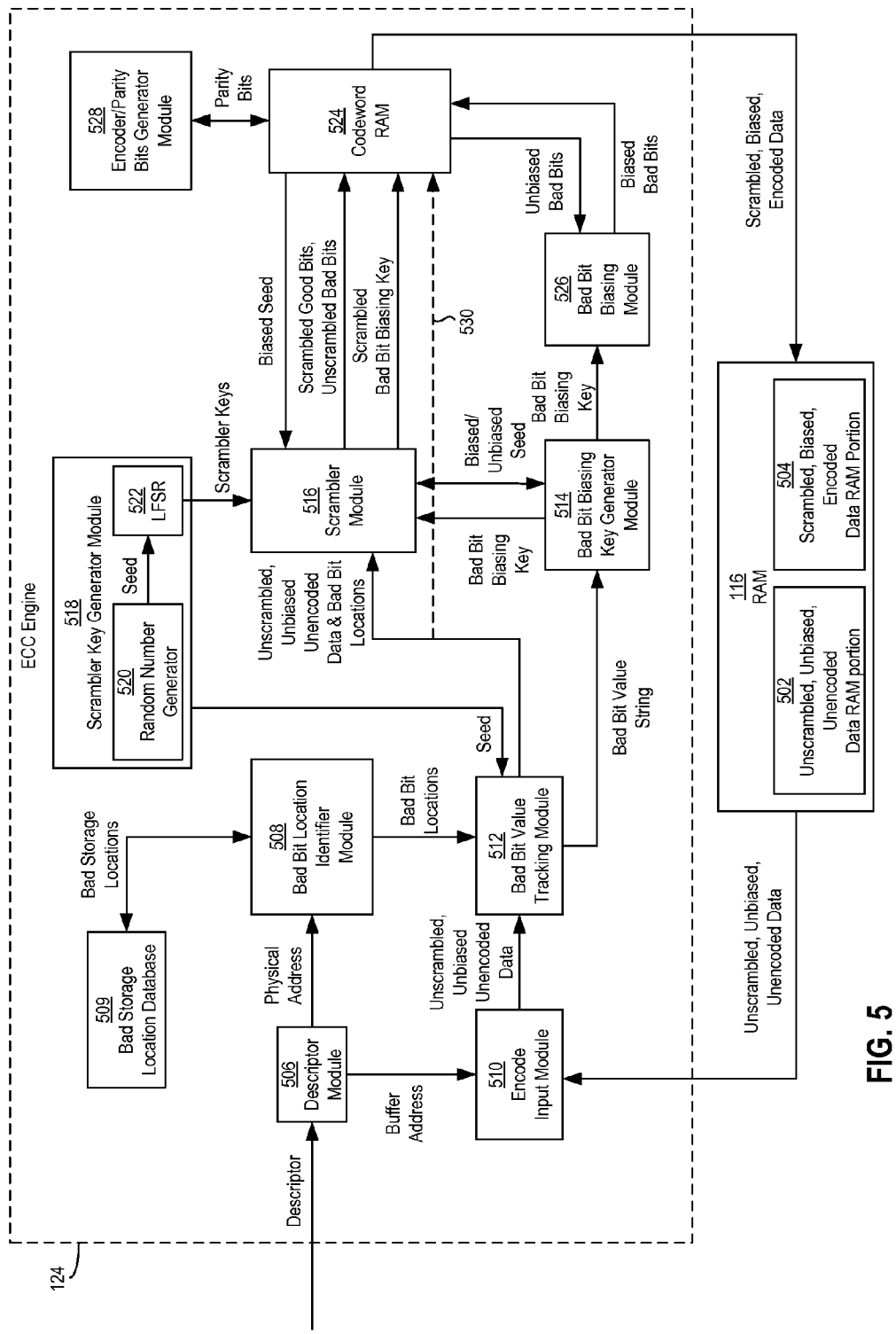
FIG. 5 is a block diagram of exemplary modules of the controller of FIG. 2A used to perform an encoding process.

In further detail, FIG. 5 shows a block diagram of components of the ECC engine 124 of the controller 102 that may be involved in an encoding process to encode data stored in the RAM 116. The encoding process may be part of a write operation to write or program the data into a non-volatile memory dies 104.

Prior to the encoding process, the data to be written into the non-volatile memory 104, such as that received from a host, may be loaded in the RAM 116 in an unscrambled, unbiased, and unencoded format. As used herein, the term "scramble" may generally refer to manipulating or flipping one or more bit values of a set of data bits so that the data set has an equal or substantially equal distribution of logic 1 and 0 bit values. As previously mentioned with respect to FIG. 2A, the encrypted data output from the encryption engine 134 may be considered to be in a scrambled format, depending on the encryption that is used. Generally, if encryption is used, data to be written into the memory die 104 may be encrypted by the encryption engine 134 before it is scrambled by a scrambling module. For purposes of the present description, unless expressly described otherwise, "unscrambled" data may be that data that has not yet passed through a scrambler module, regardless or independent of whether it has been encrypted by the encryption engine 134. Similarly, "scrambled" data, unless expressly described otherwise, may refer to that data which has passed through a scrambler module, regardless or independent of whether it has been encrypted by the encryption engine 134.

In addition, as described in further detail below, the encoding process may include subjecting bad bits to a biasing procedure. In particular, bad bits may be sent to a bad bit biasing module where a bad bit key may be used to bias at least some of those bad bits. Accordingly, as used herein, biased data may be data that has been sent to the bad bit biasing module and subjected to the biasing process, whereas unbiased data may be data that has not yet been sent to the bad bit biasing module and subjected to the biasing process.

Also, as described in further detail below, the encoding process may include generating parity bits for header and payload portions of the scrambled and biased data. In particular, after the data is scrambled and biased, an encoder module may generate parity bits for the data. Accordingly, as used herein, encoded data may be data that includes parity bits and/or data for which parity bits have been generated by the encoder module, and unencoded data may be data that does not include parity bits and/or data for which parity bits have not yet been generated by the encoder module.

FIG. 5 shows the unscrambled, unbiased, and unencoded data being stored in an unscrambled, unbiased, and unencoded data portion 502 of the RAM 116. After the encoding process, the data may be in a scrambled, biased, and encoded format, and this version of the data may be stored in the RAM 116 prior to being transferred with the memory interface 130 to the non-volatile memory die 104 for storage. FIG. 5 shows the scrambled, biased, and encoded data being stored in a scrambled, biased, encoded portion 504 of the RAM 116.

To initiate the encoding process, a descriptor module 506 may be configured to receive a descriptor from the descriptor generator module 136 (FIG. 2A). The descriptor may identify that it is a descriptor for a write operation. In addition, the descriptor may identify the buffer address where the unscrambled, unbiased, unencoded data is being stored in the RAM 116. The descriptor may also identify the physical address in the non-volatile memory die 104 where the data is to be stored.

Upon receipt of the descriptor, the descriptor module 506 may provide the physical address where the data is to be stored in the memory die 104 to a bad bit location identifier module 508. The bad bit location identifier module 508 may be configured to determine which bits of the data, if any, are to be stored in bad memory elements. To do so, in addition to receiving the physical address information, the bad bit location identifier module 508 may be configured to access a bad storage location database 509 to obtain information about bad storage locations in the memory dies 104. The bad bit location identifier module 508 may then be configured to compare the physical address information with the bad storage location information to determine which bits of the data are to be stored in bad memory elements.

The bad storage location database 509 may identify bad storage locations in various ways and/or in various degrees of granularity. In one example, the database 509 may identify bad memory elements. In other examples, bad storage locations may be identified "vertically" in that bad storage locations may be identified on a bitline basis. For example, the bad storage location database 509 may identify "bad bitlines," where each memory element coupled to the bad bitline is considered to be a bad memory element. In still another example, the bad storage location database 509 may identification "bad bitline groups," where a bitline group includes a plurality of bitlines. A bitline group may be identified as bad if it includes at least one bad bitline. In addition or alternatively, bad storage locations may be identified "horizontally" in terms of "zones" of bad memory elements coupled to the same wordline. Each zone may have an associated starting memory element and a length (number of bad memory elements). The bad bit location identifier 508 may identify a bad memory element in the bad storage location database 509 as a starting memory element of a zone. By knowing the length of the zone, the bad bit location identifier 508 may also identify a certain number of other memory elements coupled to the same wordline as being in the zone, and as such identify those memory elements in the zone as bad. The starting memory element may be addressed on a bit or a byte level of granularity.

For some example configurations, the bad memory elements or zones of bad memory elements may be identified based on a proximity or number of memory elements away from the row address decoder 146 (FIG. 2B). In further detail, the row address decoder 146 may be configured to select wordlines and drive those wordlines by applying a voltage on them to read data. Drive strength may decrease as memory elements extend further away from the row address decoder 146. For some example configurations, a threshold bitline may be determined, and memory elements coupled to bitlines further away from the row address decoder 146 than the threshold bitline may be identified in the bad storage location database 509 as bad memory elements. For other example configurations, identification of bad memory elements based on their proximity from the row address decoder 146 may on a wordline-by-wordline basis. For these other configurations, the bad storage location database 509 may identify a threshold memory element for each wordline. Each memory element coupled to that wordline that is further away from the row address decoder 146 than the respective threshold memory element may be identified as a bad memory element.

Other ways of storing and/or identifying bad storage locations in the bad storage location database 509 may be possible. In addition, the controller 102 may be configured to update (e.g., add, delete, update) the bad storage location information in the bad storage location database as the good/bad status of memory elements changes.

In addition, for non-volatile memory systems 100 that include a plurality of memory dies 104, with each memory die 104 including a memory array 142, the controller 102 may be configured to manage the bad storage locations using a single bad storage location database 509 or a plurality of bad storage location databases 509, one associated with each of the arrays 142. In addition or alternatively, bad storage location databases 509 may be maintained on a block-by-block basis. Accordingly, when the controller 102 determines to write data into a particular block, the controller 102 may access the bad storage location database 509 associated with that block.

Also, the bad storage location database(s) 509 may be stored in any or a plurality of storage locations within the non-volatile memory system 100 and/or external to the non-volatile memory system 100. For example, a bad storage location database 500 may be stored in the array or in a particular block of an array that has the bad storage locations that the database 509 identifies. So, for multi-die systems, each array may store at least one associated database 509. Alternatively, one of the dies 104 may store one or more databases 509 for all of the dies 104. Various other configurations for storing the bad storage location database(s) 509 for multi-die systems 100 may be possible. Additionally, for some example configurations, the controller 102 may be configured to load a copy of the databases(s) 509 into RAM 116 to manage the database(s) 509, such as during initialization and/or when reading and/or writing data to a particular die 104, and may update the versions of the database(s) 509 stored in the non-volatile memory dies 104 as appropriate.

The descriptor module 506 may also be configured to send the buffer address information to an encode input module 510. The encode input module 510 may be configured to access the unscrambled, unbiased, unencoded data from the RAM 116 using the buffer address information, and send the data to a bad bit value tracking module 512.

The bad bit value tracking module 512 may be configured to track and record the bit values (logic 1s and 0s) of the bad bits. In particular, the bad bit value tracking module 512 may receive information about the bad bit locations (i.e., bad memory elements) where the data is to be stored from the bad bit location identifier module 508 and identify and/or track the bit values of the bad bits of the unscrambled, unbiased, unencoded data that are to be stored in the bad memory elements. The bad bit value tracking module 512 may be configured to record the bad bit values, and send the recorded values as a string of bad bit values to a bad bit biasing key generator module 514. The bad bit tracking module 512 may also send the unscrambled, unbiased, unencoded data to a scrambler module 516. Along with the data, the bad bit value tracking module 512 may also include the bad bit location information it received from the bad bit location identifier module 508. In other example configurations, the bad bit location identifier module 508 may provide the bad bit location information directly to the scrambler module 516.

The scrambler module 516 may be configured to scramble the data so that the data has a generally equal distribution of logic 1 and 0 bit values. In one example configuration, the scrambler module 516 may be configured to scramble the data using pseudorandom scrambler keys provided by a scrambler key generator module 518. The scrambler keys may be considered pseudorandom in that they may each be generated based on a randomly generated seed, but are not purely random in the sense that they may each be reproduced using the seed, such as during a subsequent descrambling process. As shown in FIG. 5, the scrambler key generator module 518 may include a random number generator 520 that generates the seed (a random number) and sends the seed to a linear feedback shift register (LFSR) engine 522, which uses the seed to generate the scrambler keys. In general, the seed may be an n-bit number and the scrambler keys, which may also be n-bit numbers, may be bit-shifted versions of the seed. Example n-bit numbers may include 16-bit or 32-bit numbers, although other numbers may be possible. For some implementations, the seed may be an initial scrambler key that is output by the LFSR engine 522.

Upon receipt of a scrambler key from the LFSR engine 522, the scrambler module 516 may scramble an n-bit portion of the data by performing a bitwise XOR operation on the n-bit portion with the n-bit scrambler key. The result of the bitwise XOR operation may be a scrambled version of the n-bit portion, which the scrambler module 516 may output to a codeword RAM 524. After the bitwise XOR operation is performed, the scrambler module 516 may perform a next bitwise XOR operation on a next n-bit portion of the data using a next n-bit scrambler key received from the LFSR engine 522. The scrambling operations performed by the scrambler module 516 may continue in this fashion until scrambling has been performed on all of the n-bit portions of the data.

In a particular example configuration, the scrambler module 516 may be configured to scramble (e.g., perform bitwise XOR operations on) only the good bits and not the bad bits. As mentioned, the scrambler module 516 may receive the bad bit location information (either from the bad bit value tracking module 512 or directly from the bad bit location identifier 508). Using that information, the scrambler module 516 may identify which of the bits are good and which are bad, and scramble only those identified as good bits. The bad bits may be left unscrambled. This is denoted in FIG. 5. So, to illustrate, suppose that each of an n-bit portion of the data and an n-bit scrambler key are 16-bits, and that the second bit of the 16-bit portion is bad and the rest are good. The scrambler module 516 may be configured to perform bitwise XOR operations on the first and third through sixteenth bits, but not the second bit.

The data to be eventually stored in the non-volatile memory die 104 may include a payload portion and a header portion. The payload portion may include the actual data desired to be stored in the non-volatile memory die 104, which may include the data that is provided from a host. The header may include various information about the payload data, such as logical address information, the write source, when the data is written (timestamp), flag fields, and reversion numbers. The header may also include the seed. As explained in further detail below, when the data is read from the non-volatile memory die 104, the seed may be extracted from the header and used to generate/reproduce the scrambler keys in order to descramble the data. At some point after the seed is generated but before parity bits are generated to encode the data, the seed may be loaded into the codeword RAM 524 to included as part of the header.

Since the seed, as part of the header, will be stored in the non-volatile memory die 104 along with the rest of the data, the seed itself (an n-bit number) may include one or more bits that are to be stored in one or more bad memory elements. In the event that is the case, the scrambler key generator module 518 may provide the seed to the bad bit value tracking module 512, which may record the logic values of any bad bits of the seed. The bad bit tracking module 512 may also append the bad bit values of the seed to the string of bad bit values that is sent to the bad bit biasing key generator module 514. As explained in further detail below, the string of bad bit values may be used to generate a bad bit biasing key used to bias the bad bits. Recording any bad bits values of the seed and appending those bad bit values to the bad bit string may ensure that the bad bits of the seed are biased along with the other parts of the header and payload portions of the data.

Under the presumption that a bad memory element storing a data bit will identify that the bit as being stored at the same predetermined logic value regardless of whether the bit was actually programmed into the memory element at a logic 1 or a logic 0 value, it may be desirable to program that bit into the bad memory element at the predetermined logic value. In this way, there may be a relatively high likelihood that the logic value of the data when it is read from the memory element will match the logic value of the data when it was written into the memory element. The bad bit biasing key module 514 may generate a bad bit biasing key that biases as many of the bad bits to the predetermined logic value as possible. As previously mentioned, the encoding process may include encoding one ECC page of data at a time, and so the bad bit biasing key module 514 may generate a bad bit biasing key for each ECC page of data to be stored in the non-volatile memory 104.

Figure 6:
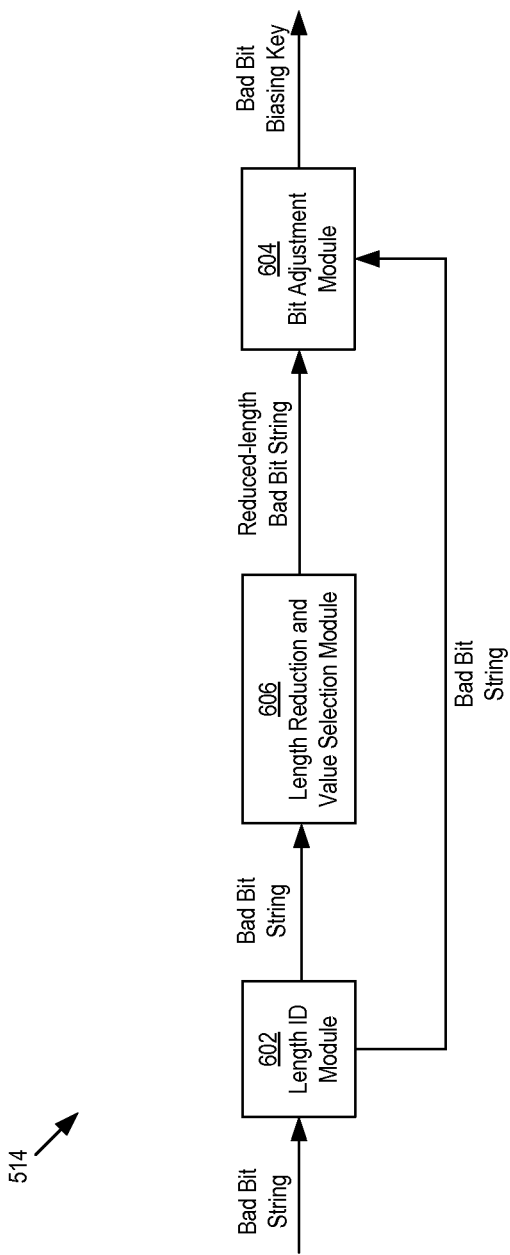
FIG. 6 is a block diagram of exemplary modules of a bad bit biasing key generator module of FIG. 5.

FIG. 6 shows an example configuration of the bad bit biasing key generator module 514 in further detail. The bad bit biasing key may have a predetermined maximum length or include a maximum m-bit number of bits. The predetermined length or m-number of bits may be a maximum number in that if the number of bad bits in the string is less than or equal to the m-bit number, then the length or number of bits of the bad bit biasing key may be equal to the number of bad bits. However, if the number of bad bits in the string exceeds the maximum m-bit number, then the bad bit biasing key will include the m-bit number of bits. To illustrate, suppose the maximum m-bit number is sixteen. As examples, if the number of bad bits in the string is twelve, then the bad bit biasing key may be twelve bits in length. If the number of bad bits is sixteen, then the bad bit biasing key may be sixteen bits in length. If the number of bad bits is seventeen, then the bad bit biasing key may be only sixteen bits in length. If the number of bits of the bad bit string exceeds the length of the m-bit bad bit biasing key, then the bad bit biasing key generator module 514 may be configured to modify the string of bad bits in accordance with the length reduction and bit value selection scheme in order to generate the bad bit biasing key.

Accordingly, the bad bit biasing key generator module 514 may include a length identification (ID) module 602 that is configured to identify the length or number of bits of the bad bit string. If the length of the bad bit string does not exceed the length set for the m-bit bad bit biasing key, then the length ID module 602 may pass the bad bit string directly to a bit adjustment module 604, which may be configured to adjust one or more bits of bad bit string in accordance with a bad bit adjustment scheme to generate the bad bit biasing key, as described in further detail below. Alternatively, if the length of the bad bit string is greater than the maximum length set for the m-bit bad bit biasing key, then the length ID module 602 may send the bad bit string to a length reduction and value selection module 606 before the string is sent to the bit adjustment module 604.

Further detail of generating a bad bit biasing key based on a string of bad bit values and in accordance with example length reduction and bit value selection and bad bit adjustment schemes is described with reference to an example shown in FIG. 7. In the example shown in FIG. 7, the bad bit value tracking module 512 identified twenty-one bad bits in an ECC page of data to be stored in an ECC page of storage in the non-volatile memory 104. The numbers above the bit values correspond to the positions of the bits in the ECC page. In the example, the ECC page includes 8,000 bits. Accordingly, the bad bit value tracking module 512 identified that bits in bit positions 50, 132, 439, 747, and so on, of the ECC page are to be stored in bad memory elements. The bad bit value tracking module 512 may combine these bad bits into a bad bit string of twenty-one bits and send the bad bit string to the bad bit key biasing generator module 514.

Suppose in the example that the length set for the m-bit bad bit biasing key is sixteen bits. As such, the length ID module 602 may determine that the length of the bad bit string exceeds the length set for the m-bit bad bit biasing key and send the bad bit string to the length reduction and value selection module 606. Under the length reduction and bit value selection scheme, the length reduction and value selection module 606 may be configured to group the bits of the 21-bit bad bit string into an m-number of bit groups (in this case sixteen bit groups), with each bit group corresponding to one of the m-number of bits of the m-bit bad bit biasing scheme. The bit groups may be determined in various ways. For some examples, the scheme may identify a maximum number of bits that can be included in a bit group.

Subsequently, when the length reduction and value selection module 606 determines the bit groups, it may then be configured to select a logic value from each group and assign that value to one of the bits of a reduced-length bad bit string. The length of the reduced-length bad bit string may be the same as the m-bit length of the bad bit biasing key. Under the scheme, the logic values may be selected for each bit group based on a majority-rule basis. If a bit group includes only one bit, then the logic value of that bit may be the selected logic value. If a bit group includes two logic values and the values are the same, then the selected logic value is the value that is in common between the two bits. However, if the logic values are different, then there is no majority value among the two logic values, and so either logic 1 or logic 0 may be arbitrarily selected. If a bit group includes three logic values, then among the three bits, one of the logic values will always be in the majority, and that majority logic value may be the value that is selected. Similar majority-rule logic value selections may be made by the length reduction and value selection module 606 for bit groups having four or more bits. When the logic values from the bit groups are selected, the selected logic values may then each be assigned to one of the bits of the reduced-length bad bit string.

Figure 7:
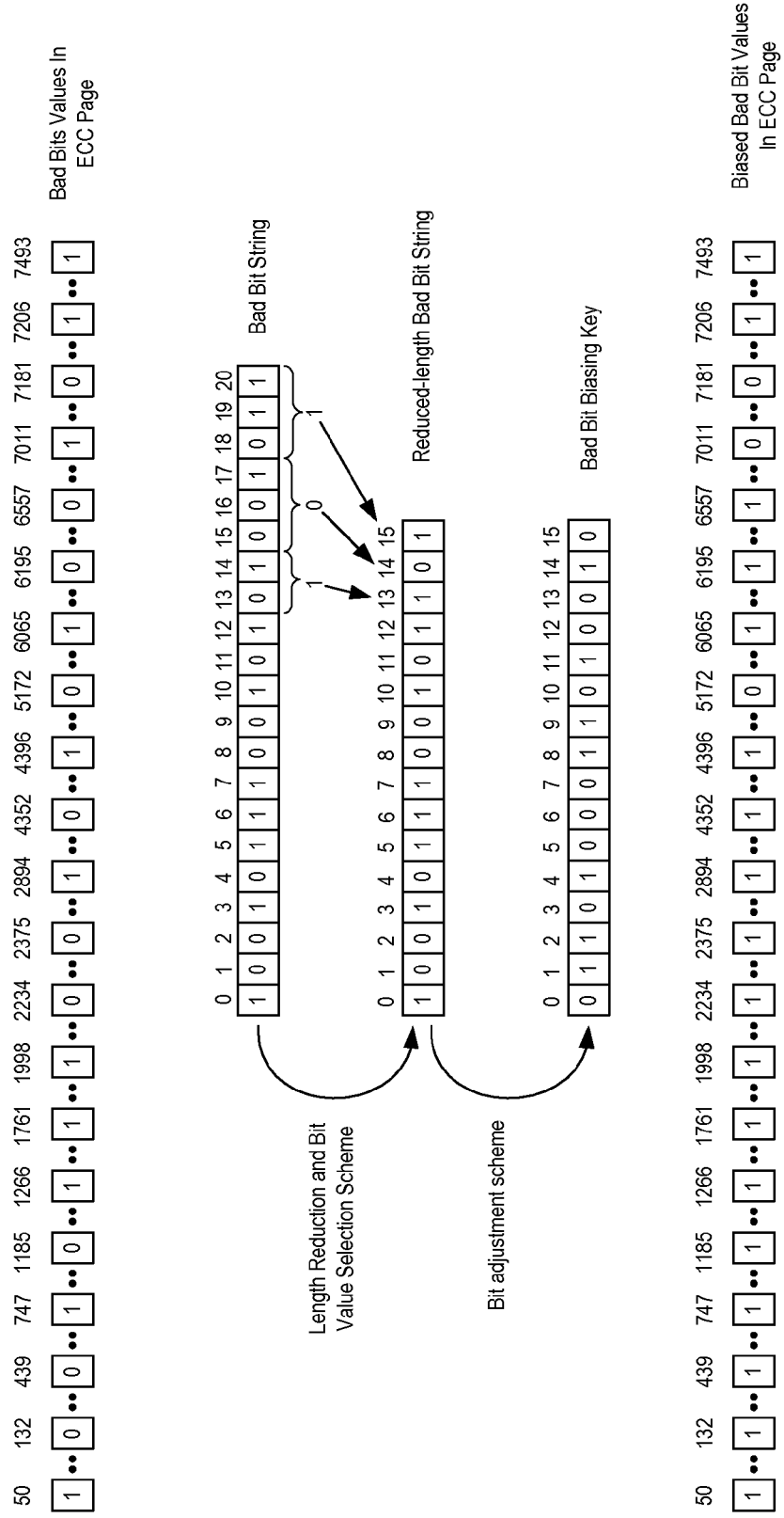
FIG. 7 is a schematic diagram of an example bad bit biasing key being generated based on bad bits, and the result of the bad bits being biased with the bad bit biasing key.

In the example shown in FIG. 7, the length reduction and bit value selection scheme may identify the maximum number of bits in a group to be three. As such, the length reduction and value selection module 606 may group the twenty-one bad bits into sixteen bit groups by assigning thirteen of the sixteen bit groups to include one bit each, one of the sixteen bit groups to include two bits, and two of the sixteen bit groups to include three bits each.

Which bits are included in which of the sixteen bit groups may be determined in various ways. For the example scheme illustrated in FIG. 7, the bits in the later bit positions are included in the multi-bit bit groups. So, since eight bits are needed to be included in three multi-bit bit groups, those eight bits may be the last eight bits of the 21-bit bad bit string (i.e., the fourteenth through twenty-first bits). In addition, for the scheme shown in FIG. 7, the bits may be included in each of the groups based on their positions in the bad bit string, and multi-bit bit groups may include bits that are next to each other in the bad bit string. Accordingly, the fourteenth bit group includes the fourteenth and fifteenth bits, the fifteenth bit group includes the sixteenth, seventeenth, and eighteenth bits, and the sixteenth bit groups includes the nineteenth, twentieth, and twenty-first bits. Various other ways for determining which bits are included in which bits groups may be possible.

In addition to determining which bits are included in which bit groups, an order of the bit groups (first bit group, second bit group, and so on) may also be determined. For the scheme shown in FIG. 7, the order of the bit groups corresponds to the order of the bits in the bad bit string. So, as examples, the first bit group, which is a one-bit bit group, includes the first bit of the bad bit string; the second bit group, which is also a one-bit bit group, includes the second bit of the bad bit string; and a last bit group, which is a three-bit bit group, includes the last three bits (bits 18, 19, and 20) of the bad bit string.

After the bit groups are determined, the length reduction and value selection module 606 may be configured to select a logic value from each of the groups based on majority rule. Since, in the example, the first thirteen bit groups include only a single bit, then for each of those bit groups, the selected logic value is the logic value of the single bit. The fourteenth bit group includes two bits, one bit having a logic 0 value and the other bit having a logic 1 value. Since there is no majority logic value, then either logic 0 or logic 1 may be arbitrarily selected. In this case, logic 1 is selected. The fifteenth bit group includes three bits, with logic 0 being the majority logic value, and so logic 0 is selected from the fifteenth bit group. Finally, the sixteenth bit group includes three bits with logic 1 being the majority logic value, and so logic 1 is selected from the sixteenth bit group.

After logic values are selected from each of the bit groups, the selected logic values may be assigned to each of the bits of the reduced-length bad bit string. Under the scheme shown in FIG. 7, which selected logic values are assigned to which bits in the reduced-length bad bit string may correspond to the order of the bit groups and the order of the bits of the reduced-length bad bit string. So, as examples, the logic value selected from the first bit group may be assigned to the first bit of the reduced-length bad bit string, the logic value selected from the second bit group may be assigned to the second bit of the reduced-length bad bit string, and so on. The logic value assignments may be consistent regardless of the number of bits in a bit group. So, for the multi-bit bit groups shown in FIG. 7, the logic value selected from the fourteenth bit group (i.e., logic 1) may be assigned to the fourteenth bit of the reduced-length bad bit string, the logic value selected from the fifteenth bit group (i.e., logic 0) may be assigned to the fifteenth bit of the reduced-length bad bit string, and the logic value selected from the last (sixteenth) bit group (i.e., logic 1) may be assigned to the last (sixteenth) bit of the reduced-length bad bit string.

After the reduced-length bad bit string is generated, then the bit adjustment module 604 may adjust one or more of the bits of the reduced-length bad bit string in accordance with a bit adjustment scheme to generate the bad bit biasing key. As previously mentioned, in order to maximize the number of bits stored in bad memory elements that are returned with correct logic levels, it may be desirable to bias as many of those bad bits as possible to the predetermined logic value that the bad memory elements are likely to return. As such, the adjustment scheme may adjust the bits of the reduced-length bad bit string (or the initial bad bit string if its length does not exceed the length of the bad bit biasing key) such that when the resulting bad bit biasing key is used to bias the initial bad bit string, the biased bad bit string will have as many of its bits at the predetermined logic value as possible. At the very least, more than 50% of the bad bits may be biased to the predetermined logic value when biased with the bad bit biasing key. As described in further detail below, the bad bit string may be biased with the bad bit biasing key using a bitwise XOR operation. Assuming in this case that the predetermined logic value is logic 1, then under XOR logic, the output bit is logic 1 when the two input bits have different logic values. As such, under the bit adjustment scheme, the bit adjustment module 604 may be configured to flip each of the bits of the reduced-length bad bit string (or the initial bad bit string) to generate the bad bit biasing key, which is shown in FIG. 7. If alternatively, if the predetermined logic value were logic 0, then the bit adjustment module 604 may be configured to keep each of the bits of the reduced-length bad bit string at their current logic levels.

Referring back to FIG. 5, after the bad bit biasing key generator module 514 generates the bad bit biasing key, it may send the key to a bad bit biasing module 526. After the good bits of the header and payload portions of the data are scrambled and loaded into the codeword RAM 524 without the bad bits being scrambled, and the bad bit biasing key is generated, the bad bit biasing module 526 may retrieve the unscrambled bad bits from the codeword RAM and bias each of the bad bits using the bad bit biasing key, such as through a read modify write process.

Referring back to the example, FIG. 7 shows the biased bad bit values in the ECC page after they are biased by the bad bit biasing module 526 using the bad bit biasing key. Which bit of the bad bit biasing key is used to bias which of the bad bits of the ECC page may be based on the respective bit positions and the bit groups in which the logic values of the bad bits were placed. With reference to the example, the first bad bit of the ECC page (bit 50) had its logic value placed in the first bit group, and so the first bit of the bad bit biasing key may be used to bias bit 50 of the ECC page. Similarly, the second bad bit of the ECC page (bit 132) had its logic value placed in the second bit group, and so the second bit of the bad bit biasing key may be used to bias bit 132 of the ECC page. For the multi-bit groups, bits 5172 and 6065 of the ECC page had their logic values placed in the fourteenth bit group, and so the fourteenth bit of the bad bit biasing key may be used to bias each of bits 5172 and 6065. The same biasing associations between the bad bits of the ECC page and the bits of the bad bit biasing key may be applied to the other bad bits. So, for example, bits 6195, 6557, and 7011 may each be biased by the fifteenth bit of the bit biasing key, and bits 7181, 7206, and 7493 may each be biased by the sixteenth bit of the bad bit biasing key.

In the example shown in FIG. 7, the bad bit biasing key was not able to bias all of the bad bits to the predetermined logic 1 value because the logic values in the multi-bit groups were not all the same. For example, because logic 1 was selected for the fourteenth bit group but bit 5172 was at logic 0, when the fourteenth bit of the bad bit biasing key biased bit 5172, the result was logic 0 under XOR logic. Similar results occurred for bits 7011 and 7181 since those bits had minority logic values in their respective bit groups.

When the number of bad bits in the ECC page (or the n-number of bits of the bad bit string) does not exceed the maximum m-number of bits of the bad bit biasing scheme, a one-to-one correspondence or association may be established between the bad bits of the ECC page and the bits of the bad bit biasing key. So, for example, if an ECC page of data includes sixteen bad bits and the bad bit biasing key also includes sixteen bits, a one-to-one correspondence may be established between the bad bits of the ECC page and the bits of the bad bit biasing key to bias the bad bits. When this situation occurs, the bad bit biasing key may be generated such that it is able to bias all of the bad bits of the ECC page to the predetermined logic value. This may be referred to as 100% bad bit biasing. Alternatively, when the number of bad bits in the ECC page is greater than the number of bits of the bad bit biasing key, then one or more multi-bit bit groups are formed and there may not be a one-to-one correspondence between the bad bits of the ECC page and the bits of the bad bit biasing key. For these situations, since there is not a one-to-one correspondence, then depending on the logic values in the bad bit string, the bad bit biasing module 526 may not be able to bias all of the bad bits to the predetermined logic value, which may result in less than 100% bad bit biasing.

Based on the n-number of bad bits in an ECC page of data, the maximum m-number of bits of the bad bit biasing key, and the maximum number of bits that may be included in a bit group under the length reduction and bit value selection scheme, a percentage of bad bit biasing may be determined for that ECC page of data. Each bad bit biasing percentage may indicate a statistical or average percentage, or percent likelihood, of the number of the bad bits that may be biased to the predetermined logic value using the bad bit biasing key, given the n-number of bad bits, the maximum m-number of bits of the bad bit biasing key, and the maximum number of bits that may be included in each bit group. The below table shows percentages of bad bit biasing corresponding to different numbers of bad bits in an ECC page, from 36 bad bits to 63 bad bits, where the bad bit biasing key has a maximum length of 32 bits and the maximum number of bits that can be included in a bit group is three.

| # of Bad Bits in ECC Page | Percentage of Bad Bit Biasing |
| --- | --- |
| 31 | 100 |
| 32 | 100 |
| 33 | 98.4 |
| 34 | 97.8 |
| 35 | 96.4 |
| 36 | 95.8 |
| 37 | 94.6 |
| 38 | 94.1 |
| 39 | 92.9 |

-continued

| # of Bad Bits in ECC Page | Percentage of Bad Bit Biasing |
|---|---|
| 40 | 92.5 |
| 41 | 91.5 |
| 42 | 91.1 |
| 43 | 90.1 |
| 44 | 89.8 |
| 45 | 88.9 |
| 46 | 88.6 |
| 47 | 87.8 |
| 48 | 87.5 |
| 49 | 86.7 |
| 50 | 86.5 |
| 51 | 85.8 |
| 52 | 85.6 |
| 53 | 84.9 |
| 54 | 84.7 |
| 55 | 84.1 |
| 56 | 83.9 |
| 57 | 83.3 |
| 58 | 83.2 |
| 59 | 82.6 |
| 60 | 82.5 |
| 61 | 82 |
| 62 | 81.9 |
| 63 | 81.3 |
| 64 | 81.3 |
| 65 | 80.7 |

Looking at the table, if a 32-bit bad bit biasing key is used and bad bits are grouped into 32 bit groups of 3-bits or less, even if an ECC page has 63 bad bits, the bad bit biasing key generated as described above may, on average, bias about 81% of the 63 bad bits to the predetermined logic value. As previously mentioned, assuming the data is scrambled so that there is a generally even distribution of logic 1 and logic 0 values being stored, if the bad bits are not biased as described and rather just scrambled, only about 50% of the data stored in bad memory elements will be returned at correct or expected logic values. In contrast, biasing more than 50% of the bad bits to the predetermined logic value using the bad bit biasing key rather than scrambling them may increase the number or percentage of bad bits that are returned with correct or expected values from the non-volatile memory 104 to above 50%.

Referring to FIG. 5, the bad bit biasing key generated by the bad bit biasing key generator module 514 may be included in the header of the data. During a subsequent read operation to read the data, the bad bit biasing key may then be extracted from the header and used to unbias the biased bits so that the bad bits may be sent to the host at their correct logic values. In some situations, the data that the host initially sends to be stored in the non-volatile memory die 104 may be in the form of a pattern of logic values (e.g., 555, CCC, FFF, or other checkboard patterns as examples). These patterns may cause similar bad bit biasing keys to be generated for different ECC pages of data to be stored in the same block of storage. This may result in patterns of data stored in a block of storage, which may lead to data storage problems. Accordingly, it may be desirable to scramble the bad bit biasing key before including it in the header in order to randomize the bits of the bad bit biasing key and avoid bit patterns of stored data.

As shown in FIG. 5, before the bad bit biasing key is loaded into the codeword RAM to be included in the header, the bad bit biasing key generator module 514 may first send the bad bit biasing key to the scrambler module 516, which may scramble the bad bit biasing key in order to avoid any patterns of stored data in the non-volatile memory die 104.

As previously described, the seed may include one or more bad bits, which may be recorded by the bad bit value tracking module 512 and factored into generation of the bad bit biasing key. Also as previously described, the seed may be loaded into the codeword RAM 524 to be included with the header. Accordingly, if the seed includes bad bits, those bad bits may be biased by the bad bit biasing module 526 during the biasing process, and so the version of the seed that is stored in the non-volatile memory die 104 is the biased version. However, as described in further detail below, when both a biased version of the seed and a scrambled version of the bad bit biasing key are stored in the memory die 104, and when the data is subsequently read, the biased seed will be used to unscramble the scrambled bad bit biasing key, and then the unscrambled bad bit biasing key will be used to unbias the biased seed. Since the biased version of the seed is used to unscrambled the scrambled bad bit biasing key during a read operation, then that is the version that should be used to scramble the bad bit biasing key during the write operation. Accordingly, as shown in FIG. 5, after the bad bit biasing module 526 biases the bad bits, the scrambler module 516 may receive the biased seed from the codeword RAM 524 and use the biased seed to scramble the bad bit biasing key. The scrambled bad bit biasing key may then be loaded into the codeword RAM 524 as part of the header.

After the good, scrambled bits and the bad, biased bits, along with the scrambled bad bit biasing key, are loaded into the codeword RAM 524, an encoder module 528 may access the data in the codeword RAM 524 and encode the data. In particular, the encoder 528 may analyze the data to generate a set of parity bits associated with the payload and header portions of the data. The parity bits may be generated during encoding in order to detect and correct errors of the header and payload portions during a decoding phase of a read operation to read the data from the non-volatile memory die 104. After the encoder module 528 generates the parity bits, they may be added to the header and payload portions to form the scrambled, biased, and encoded version of the data, which may then be sent to the scrambled, biased, encoded data portion 504 of the RAM 116. After the scrambled, biased, encoded data is generated, the controller 102 may transfer it to the non-volatile memory die 104 as part of the write operation.

Figure 8:
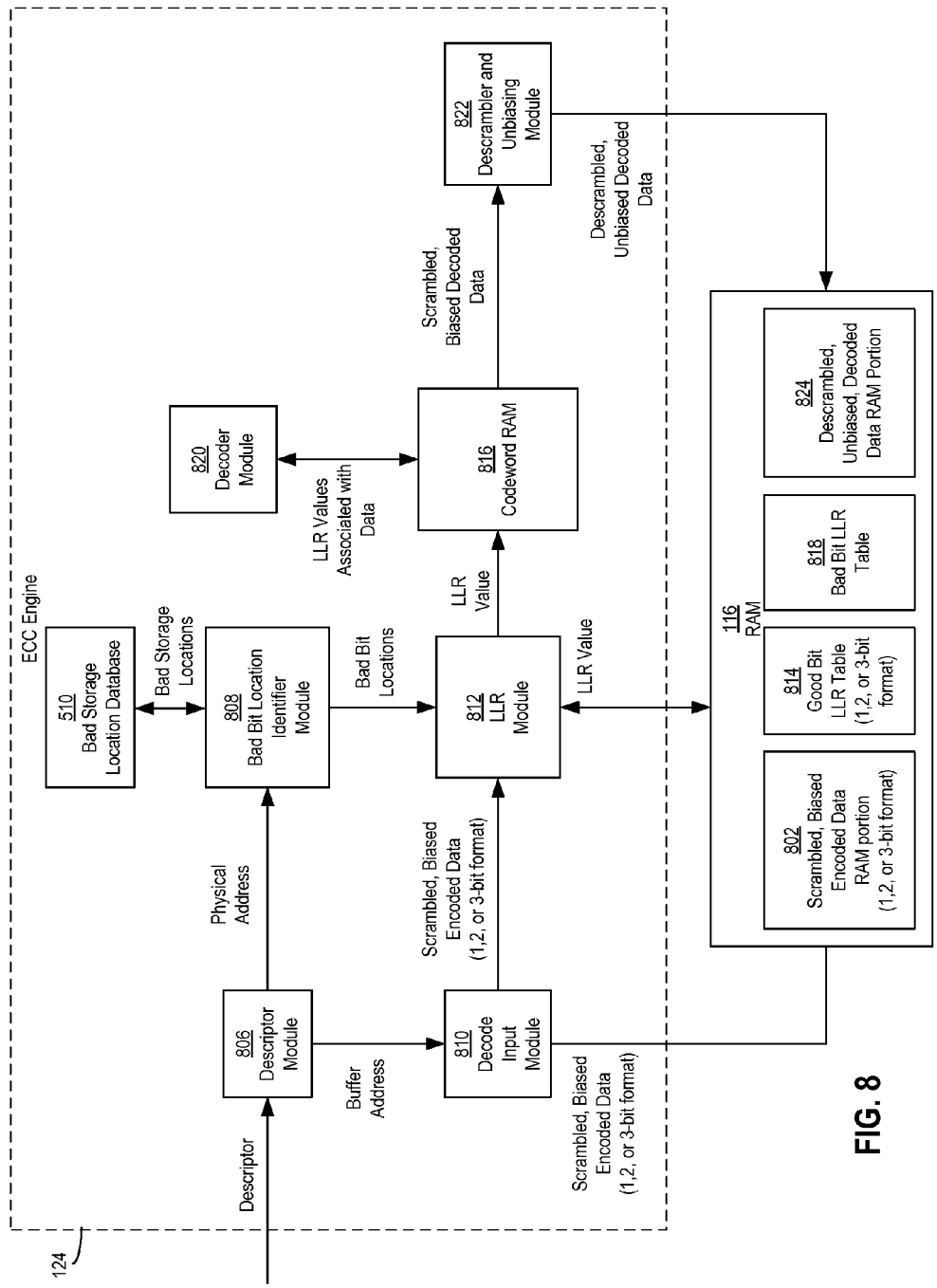
FIG. 8 is a block diagram of exemplary modules of the controller of FIG. 2A used to perform a decoding process.

FIG. 8 shows a block diagram of components of the ECC engine 124 of the controller 102 that may be involved in a decoding process to decode data stored in the RAM 116. The decoding process may be part of a read operation to read scrambled, biased, and encoded data from a non-volatile memory die 104. That is, when the scrambled, biased, and encoded data is to be read from the non-volatile memory die 104, such as in response to a host read request, the controller 102, using the memory interface 130, may communicate with the memory die 104 to retrieve the data and load the data into the RAM 116. The ECC engine 124 may then decode the data loaded in the RAM 116. FIG. 8 shows the scrambled, biased, and encoded data being stored in a scrambled, biased, and encoded data portion 802 of the RAM 116.

The scrambled, biased, and encoded data may be loaded into the RAM 116 in a one-bit, two-bit, or three-bit format. In the one-bit format, the scrambled, biased, and encoded data read from the non-volatile memory 104 may include single-bit representations of each of the bits of the scrambled, biased, and encoded data that was written into the non-volatile memory die 104. These single-bit representations, referred to as hard bits, may each have a logic 1 or logic 0 value and are indicative of the values of the bits as read from the non-volatile memory die 104. In the two-bit format, the scrambled, biased, and encoded data read from the non-volatile memory 104 may include two-bit representations of each of the scrambled, biased, and encoded data that was written into the non-volatile memory die 104. The two-bit representations may each include the hard bit and one soft bit, which may also have a logic 1 or logic 0 value. The soft bit added to the hard bit provides a probability or a confidence level that the value of the hard bit is correct, i.e., it matches the value of the bit when written into the memory die 104. In combination, the hard bit and soft bit provide four different binary values. In the three-bit format, the scrambled, biased, and encoded data read from the non-volatile memory 104 may include three-bit representations of each of the bits of the scrambled, biased, and encoded data that was written into the non-volatile memory die 104. The three-bit representations may each include the hard bit and two soft bits, each of which may have a logic 1 or logic 0 value. Like the single soft bit, the two soft bits added to the hard bit provides a probability or confidence level that the value of the hard bit is correct. In combination, the hard bit and two soft bits provide eight different binary values.

To initiate the decoding process, a descriptor module 806 may be configured to receive a descriptor from the descriptor generator module 136 (FIG. 2A). The descriptor may identify that it is a descriptor for a read operation. In addition, the descriptor may identify the buffer address where the scrambled, biased, and encoded data is being stored in the RAM 116. The descriptor may also identify the physical address in the non-volatile memory die 104 where the scrambled, biased, and encoded data is stored.

As with the encoding process, upon receipt of the descriptor, the descriptor module 806 may provide the physical address information to a bad bit location identifier module 808, which may be configured to determine which bits of the data, if any, are stored in bad memory elements. To do so, the bad bit location identifier module 808 may be configured to compare the physical address information received from the descriptor module 806 with bad storage location information it accesses from the bad storage location database 510. Based on the comparison, the bad bit location identifier module 808 may determine which bits of the scrambled, biased, and encoded data are stored bad memory elements.

The descriptor module 806 may also be configured to send the buffer address information to a decode input module 810. The decode input module 810 may be configured to access the scrambled, biased, and encoded data loaded in the RAM 116 using the buffer address information, and send the data to a log likelihood ratio (LLR) module 812.

Figure 9:
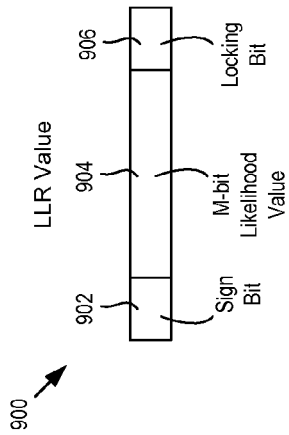
FIG. 9 is a schematic diagram of an example log likelihood ratio (LLR) value assigned by an LLR module of FIG. 8.

The LLR module 812 may be configured to assign an associated LLR value for each of the bits of the scrambled, biased, and encoded data. An LLR value may indicate whether the bit with which it is associated has a logic 1 or logic 0 value, and a likelihood or confidence level of that value being correct—i.e., that the logic value of the bit as it was read from the die 104 matches the logic value of the bit as it was written into the die 104. FIG. 9 shows a schematic diagram of an example LLR value 900. The LLR value 900 may include a sign bit 902, which may indicate whether the associated bit is read from the memory die 104 as a logic 1 or logic 0 value. The value of the sign bit 902 may correspond to the logic value of the hard bit. The LLR value 900 may also include an M-bit likelihood value component 904, which may indicate a likelihood or confidence level of the sign bit 902 representing the correct value of the associated bit. The sign bit 902 and the M-bit likelihood value component 904, together, may be a combined (M+1)-bit value representing a number in a range from a lower bound of $-2^M$ to an upper bound of $+2^M$. One of the bounds, such as the lower bound, may be correspond to the logic 0 value, and the other bound, such as the upper bound, may correspond to the logic 1 value. The closer the (M+1)-bit number is to a bound, the higher the likelihood or confidence level that the logic level corresponding to that bound is the correct logic value for the associated bit. The (M+1)-bit number being equal to a bound may indicate that there is a 100% likelihood or confidence level that the logic value corresponding to that bound is the correct logic level for the associated bit.

In one example, M is 6, and so the combined sign bit 902 and the 6-bit likelihood value component 904 may represent a number in the range from −64 to +64. The closer the combined 7-bit number is to −64, the greater the likelihood or confidence level that the hard bit read at the logic 0 value is the correct value for that bit. Similarly, the closer the combined 7-bit number is to +64, the greater the likelihood or confidence level that the hard bit read at the logic 1 value is the correct value for that bit.

In addition to the sign bit 902 and the M-bit likelihood value component 904, the LLR value 900 may include a locking bit 906. As described in further detail below, in the event that the ECC engine 124 detects errors in the scrambled, encoded data, a decoder module 820 (FIG. 8) may determine to adjust one or more LLR values by flipping the sign bit 902 and/or adjusting the M-bit likelihood value component 904. In the event that the decoder module 820 determines to adjust one or more LLR values, the decoder module 820 may be configured to refrain from adjusting LLR values that are locked, as indicated by the values of their respective locking bits. Conversely, in the event that the decoder module 820 determines that LLR values need to be adjusted, the decoder module 820 may be configured to identify LLR values as being available for adjustment if they are not locked, as indicated by the values of their respective locking bits.

As mentioned, when the decoding process is initiated, the decode input module 810 may retrieve the scrambled, biased, and encoded data stored in the RAM 116 and send the data to the LLR module 812. The data may be sent to the LLR module 812 as either one-bit, two-bit, or three-bit representations of the associated data stored in the memory die 104, as described. In addition to receiving the n-bit (1-bit, 2-bit, or 3-bit) representations, the LLR module 812 may also be configured to receive bad bit location information from the bad bit location identifier module 808. Using the bad bit location information, the LLR module 812 may be configured to determine, for each n-bit representation, whether or not each of the associated bits stored in the die 104 is stored in a bad memory element. The LLR module 812 may then be configured to assign a LLR value for the associated bit based on the determination.

In further detail, if the LLR module 812 determines that the associated bit is not stored in a bad memory element, then the LLR module 812 may be configured to assign a LLR value for that bit by accessing a good bit LLR table 814 that contains LLR value information. In particular, the good bit LLR table 814 may include associations between the possible n-bit representation values and LLR value information. The LLR value information may include either a complete LLR value or at least portion of a LLR value. For example, each n-bit representation value identified in the LLR table 814 may be associated with at least the M-bit likelihood value component 904 of a LLR value, and optionally include the sign bit 902 and/or the locking bit 906. For implementations where the sign bit 902 and/or the locking bit 906 are not included in the good bit LLR table 814, the LLR module 812 may be configured to add those bits to the M-bit likelihood value component 904 before sending the complete LLR value to a codeword RAM 816. Additionally, the number of entries in the good bit LLR table 814 may correspond to the number of bits in the n-bit representations, particularly $2^n$. Accordingly, if the scrambled, encoded data loaded into the RAM 116 includes one-bit representations, then the good bit LLR table 814 may include two entries, one entry associating logic value 0 to first LLR value information, and another entry associating logic value 1 to second LLR value information. Similarly, if the scrambled, encoded data loaded into the RAM 116 includes two-bit representations (one hard bit and one soft bit), then the good bit LLR table 814 may include four entries, and if the scrambled, encoded data loaded into the RAM 116 includes three-bit representations (one hard bit and two soft bits), then the good bit LLR table 814 may include eight entries.

Upon receiving an n-bit representation and identifying that the bit with which it is associated is not stored in a bad memory element, the LLR module 812 may query the good bit LLR table 814 to obtain associated LLR value information. In particular, the LLR module 812 may locate an entry in the good bit LLR table 814 having an n-bit representation value that matches the value of the n-bit representation the LLR module 812 received, and retrieve the LLR value information associated with the matching n-bit representation value. If the LLR value information does not include a complete LLR value, then the LLR module 812 may add a sign bit and/or a locking bit to the LLR value information obtained from the good bit LLR table 814. Since the associated bit is identified as not being stored in a bad memory element, then the locking bit, either as it is included with the other LLR value information in the good bit LLR table 814 or as it is added to the M-bit likelihood value component by the LLR module 812, may be set to a value indicating that the LLR value is unlocked. The LLR module 812 may then send the LLR value to the codeword RAM 816 for temporary storage before the decoding process.

Alternatively, if the LLR module 812 determines that the associated bit is stored in a bad memory element, then the LLR module 812 may be configured to assign a LLR value for the associated bit without accessing the good bit LLR table 814, and instead by assigning a LLR value that corresponds to a percentage of bit biasing determined when biasing the bad bits during the encoding process. When the LLR module 812 receives the bad bit location information from the bad bit location identifier module 808, the LLR module may be configured to determine the number of bad bits in the ECC page of data that is being decoded. In response, the LLR module 812 may access a bad bit LLR table 818, which may include information similar to that included in the above table. Particularly, the bad bit LLR table 818 may include a plurality of entries, with each entry including a first field indicating a number of bad bits in an ECC page and a second field indicating an associated percentage of successful bad bit biasing. Each entry may also include a third field identifying LLR value information that includes at least an M-bit likelihood value component. The M-bit likelihood value components may correspond and to the percentages identified in the entries and vary proportionately to the variation in the percentages among the entries. So, as the percentages increase among the entries, so do the M-bit likelihood value components, and as the percentages decrease among the entries, so do the M-bit likelihood value components.

In addition, since biasing the bad bits involves biasing them to a predetermined logic value, then the sign bit for the LLR value may correspond to that predetermined logic value. Also, the locking bit may be assigned to the LLR value based on whether or not 100% bad bit biasing was achieved when biasing the data during the encoding process. If 100% bad bit biasing was achieved, then the LLR module 812 may know with 100% certainty that the associated bad bit for which it is assigning a LLR value was initially programmed into the bad memory element at the predetermined logic value. As such, the LLR module 812 may set the locking bit to a value that locks the LLR value. Alternatively, if biasing was performed with less than 100% bad bit biasing, then the LLR module may not know with 100% certainty that the associated bad bit for which it is assigning a LLR value was programmed into the bad memory element at the predetermined logic level. As such, the LLR module 812 may set the locking bit to a value that identifies the LLR value as being unlocked. Depending on the implementation, the sign bit and/or the locking bit may either be included with the M-bit likelihood value component in the bad bit LLR table 818, or the LLR module 812 may be configured to add the sign bit and/or the locking bit to the M-bit likelihood value component, as appropriate. In still other implementations, the LLR module 812 may be configured to determine the percentage of bad bit biasing and/or the M-bit likelihood value component without accessing the bad bit LLR table 818, such as by being configured with internal logic capable of determining the bad bit biasing percentage and/or the M-bit likelihood value component upon receiving the bad bit information from the bad bit location identifier module 808.

The following illustrates operation of the LLR module 812 in an example situation where the LLR module 812 receives two two-bit representations of scrambled, biased, and encoded data during a decoding process. Suppose for the example situation that a first two-bit representation has the logic value "01," where the hard bit is logic 0 and the soft bit is logic 1, and that the second two-bit representation has the logic value "10," where the hard bit is logic 1 and the soft bit is logic 0. Further suppose for the example situation that the bit associated with the first two-bit representation "10" is stored in a good memory element, and that the bit associated with the second two-bit representation "01" is stored in a bad memory element.

The LLR module 812 may receive the first two-bit representation "01" and in response determine that the bit associated with the first two-bit representation is stored in a good memory element. In response, the LLR module 812 may access the good bit LLR table 814, find the entry for the two-bit logic value "01," and retrieve the LLR value information associated with that two-bit logic value. For some implementations, the LLR value information may include only the M-bit likelihood value component, and so the LLR module 812 may be configured to append, to the M-bit likelihood value component, a sign bit with a logic 0 value corresponding to the logic 0 value of the hard bit and a locking bit with a logic value (e.g., a logic 0 value) indicating that the LLR value is unlocked since the associated bit is stored in a good memory element. For other implementations, the LLR value information may include the sign bit and/or the locking bit, and so the LLR module 812 may not have to append the sign bit and/or the locking bit as appropriate. When the LLR value associated with the first two-bit representation "01" is in its completed form, the LLR module 812 may send the LLR value to the codeword RAM 816.

Subsequently, the LLR module 812 may receive the second two-bit representation "10" and in response determine that the bit associated with the second two-bit representation "10" is stored in a bad memory element. In response, the LLR module 812 may determine the number of bad bits in the ECC page being decoded. Based on that number, the LLR module may determine a LLR value having an M-bit likelihood value component that corresponds to a percentage of bad bit biasing associated with the number of bad bits. In addition, the LLR value that the LLR module 812 determines may have a sign bit corresponding to the predetermined logic value. The logic value of the sign bit may be set regardless of the logic value of the hard bit that is read. Also, if the percentage of bad bit biasing is 100%, then the LLR value may include a locking bit set to a logic value that locks the LLR value. Alternatively, if the percentage of bad bit biasing is less than 100%, then the locking bit may be at a logic value that unlocks the LLR value. When the LLR value associated with the second two-bit representation "10" is in its completed form, the LLR module 812 may send the LLR value to the codeword RAM 816.

The LLR module 812 may assign LLR values for each of the bits of the scrambled, encoded data in this manner until all of the bits have been assigned LLR values and these LLR values are sent to the codeword RAM 816. After all of the LLR values are stored in the codeword RAM 816, the decoder module 820 may access the LLR values and perform decoding. In one example, the decoder module 820 may use the parity bits in conjunction with a matrix that represents a set of polynomial equations to achieve convergence.

If convergence is achieved, then the decoder module 820 may determine that the sign bits of the LLR values are correct, and in turn determine that the scrambled, biased, and encoded data is correctly read from the non-volatile memory die 104. Alternatively, if convergence is not achieved (i.e., one or more of the equations are failing), then the decoder module 120 may determine that the sign bit of one or more LLR values is incorrect, and in turn determine that there are errors in the scrambled, biased, and encoded data read from the memory die 104. As a result, the decoder module 820 may determine to flip the sign bit of one or more LLR values and then re-attempt to solve the polynomial equations to achieve convergence.

To determine which of the LLR values to select to flip the sign bits, the decoder module 820 may look to the M-bit likelihood value components. The decoder module 820 may be more prone to flip sign bits for those LLR values with lower M-bit likelihood value components since they indicate a lower likelihood or confidence level that their sign bits are correct. In addition or alternatively to looking at the M-bit likelihood value components, the decoder module 820 may look to the locking bit. If the locking bit for a particular LLR value indicates that the LLR value is locked, the decoder module 820 may deem the LLR value as being unavailable to have its sign bit flipped, and as such, avoid flipping the sign bit of that LLR value. Conversely, if the locking bit indicates that the LLR value is unlocked, the decoder module 820 may then deem that LLR value as being available to have its sign bit flipped.

As mentioned, for configurations that do not bias bits to the predetermined logic value prior to storing the bits in bad memory elements, there may be about a 50% chance of reading those bad bits at their correct logic levels. Conversely, by (1) biasing as many of those bad bits as possible to the predetermined logic value using a bad bit biasing key during encoding, and then (2) when decoding, setting their corresponding LLR values to have sign bits corresponding to the predetermined logic value and an M-bit likelihood value component indicative of a statistical or average percentage, above 50%, of the number of bad bits that were biased to the predetermined logic value using the bad bit biasing key, and optionally (3) locking LLR values for bad bits that were biased with 100% bad bit biasing, there may be fewer errors identified by the decoder module 820 and generally less work (or less bit flipping) that the decoder module 820 may need to do in order to correct any errors and reach convergence. As a result, overall error correcting during read operations may be enhanced.

In an alternative example implementation of the above-described LLR generation portion of the decoding process, the LLR values may not include locking bits. Accordingly, for bad bit values, the LLR module 812 may assign an M-bit likelihood value component corresponding to the bad bit biasing percentage, but may not append a locking bit to the LLR value.

Additionally, for some example implementations, the LLR module 812 may not identify whether the n-bit representations it receives are associated with good bits or bad bits and assign LLR values based on that identification unless or until an uncorrectable read error event is triggered during the decoding process. An uncorrectable read error event may occur when the number of errors in the scrambled, biased, and encoded data is too numerous that the decoder module 820 is unable to achieve convergence, regardless of how many times it attempts to flip various sign bits. As such, an uncorrectable read error event may indicate that the number of errors in the sensed, biased, and encoded data read from the memory dies 104 has exceeded a threshold number. When an uncorrectable read error event occurs, the decode input module 810 may re-access the scrambled, biased, and encoded data in the RAM 116 and pass it once again through the LLR module 812 to reassign LLR values for bits stored in bad bit locations. Prior to detection of an uncorrectable read error event, the LLR module may treat each n-bit representation it receives as the same and use the good bit LLR table 814 to assign LLR values for each of the bits.

Assuming that convergence is achieved, decoding performed by the decoding module 820 may be complete and the sign bits of the LLR values (some of which may have been changed during decoding) of the payload and header portions may be sent as scrambled, biased, and decoded data to a descrambler and unbiasing module 822 to descramble and unbias the data in order to format the data into its original, unscrambled and unbiased form. For purposes of the present description, decoded data may specifically indicate that the data was decoded by the decoding module 820, but decoded data and unencoded data may be considered to be the same version or in the same format. Similarly, descrambled data may specifically indicate that the data was descrambled by the descrambler module 822, but unscrambled data and descrambled data may be considered to be the same version or in the same format.

Figure 10:
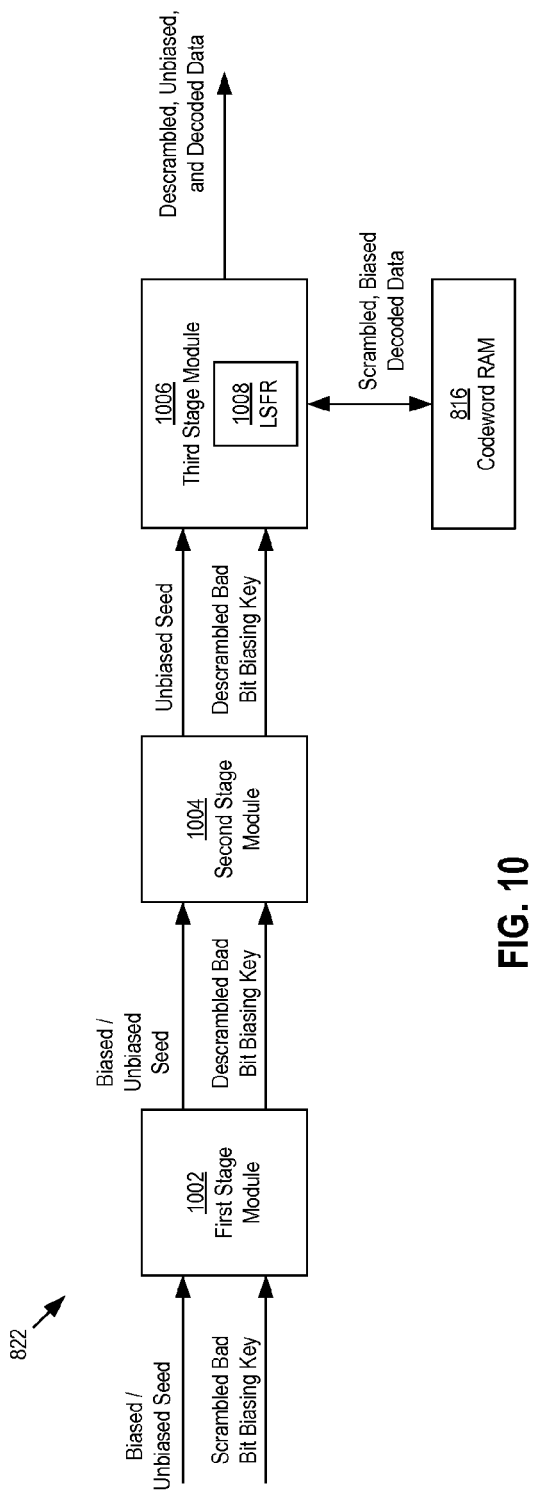
FIG. 10 is a block diagram of exemplary modules of a descrambler and unbiasing module of FIG. 8.

FIG. 10 shows a block diagram of an example configuration of the descrambler and unbiasing module 822. As previously described, the seed may be in a biased version and the bad bit biasing key may be in scrambled version when stored in the non-volatile memory 104. Since, during encoding, the unscrambled bad bit biasing key biased the seed and the biased seed then scrambled the bad bit biasing key, then during decoding, the biased seed should descramble the scrambled bad bit biasing key, and the descrambled bad bit biasing key should then unbias the biased seed. Alternatively, if the seed did not include any bad bits, then an unbiased version of the seed will be stored in the non-volatile memory 104 and sent to the descrambler and unbiasing module 822 when read. In that situation, the unbiased seed may be used to descramble the scrambled bad bit biasing key, and no subsequent unbiasing of the seed may be performed. Thereafter, the unbiased seed and the descrambled bad bit biasing key may be used to descramble and unbias the remaining data.

Accordingly, FIG. 10 shows that the descrambler and unbiasing module 822 may include a first stage module 1002 configured to receive a biased or unbiased seed and the scrambled bad bit biasing key. The first stage module 1002 may descramble the scrambled bad bit biasing key by performing a bitwise XOR operation on the scrambled bad bit biasing key with the biased/unbiased seed. The first stage module 1002 may then send the biased/unbiased seed and the descrambled bad bit biasing key to a second stage module 1004. If the seed is biased, then the second stage module 1004 may unbias the biased seed by performing a bitwise XOR operation on the bad bits of the biased seed with the descrambled bad bit biasing key. Alternatively, if the seed is unbiased to begin with, then the second stage module 1004 may merely allow the unbiased seed and the descrambled bad bit biasing key to pass through without performing any unbiasing. The second stage module 1004 may then send the unbiased seed and the descrambled bad bit biasing key to a third stage module 1006, which may descramble and unbias the remaining header and payload portions of the ECC page using the unbiased seed and the descrambled bad bit biasing key.

To descramble the good bits of the remaining data, the third stage module 1006 may include a LFSR engine 1008, which may receive the descrambled seed and regenerate the scrambler keys used to initially scramble the n-bit portions of the data. The third stage module 1006 may also access the n-bit portions of data, in their scrambled form, from the codeword RAM 816 and perform bitwise XOR operations on them using the scrambler keys generated by the LFSR engine 1008. In addition, the third stage module 1006 may unbias the bad bits of the remaining data by performing XOR operations on them using the descrambled bad bit biasing key. The third stage module 1006 may be configured to identify and unbias the bad bits in the same way that the bad bit biasing module 526 identified the bad bits and biased them using the bad bit biasing key, such as through a read modify write process.

Referring back to FIG. 8, after the data is descrambled and unbiased by the descrambler and unbiasing module 822, the descrambler module 822 may load the descrambled, unbiased, and decoded data into a descrambled, unbiased, decoded data portion 824 of the RAM 116. Thereafter, the controller 102 may be configured to send the descrambled, unbiased, and decoded data to its final destination, such as to a host, to complete the read operation.

Variations of the above-described encoding and decoding processes may be implemented. For example, in some configurations that encrypt the data by the encryption (AES) engine 134 (FIG. 2A), the encryption may provide sufficient scrambling of the good bits. As such, referring to FIG. 5, in an alternative implementation of the encoding process, the scrambler module 516 may be eliminated (or bypassed), and unscrambled, unbiased, and unencoded data may be sent directly from the bad bit value tracking module 512 to the codeword RAM 524, as indicate by dotted arrow 530. As such, a seed may not be used to either encode or decode the data and hence may not be stored as part of the header in the non-volatile memory 104. Further, any patterns of data sent by the host may be sufficiently scrambled by the encryption engine 134, and so scrambling the bad bit biasing key prior to storage in the non-volatile memory 104 may not be necessary. Accordingly, referring to FIG. 10, the first and second stage modules 1002, 1004 of the descrambler and unbiasing module 822 may be removed (or bypassed) since there may be no need to unbias a biased seed or descramble a scrambled bad bit biasing key. In addition, the third stage module 1006 may bias the bad bits but may not perform any descrambling of the good bits since no scrambling with the scrambler module 516 was performed during encoding.

In another alternative implementation, the header portions of the data may not be encrypted with the encryption engine 134, and so at least the header portions of the data may be sent through the scrambler module 516. As such, a seed may be generated and that seed, if it includes bad bits, may be biased before being stored in the non-volatile memory 104. However, if the encryption engine 134 is considered to sufficiently scramble the payload portion of the data, then the negative impact of patterns of bad bit biasing keys being stored in the non-volatile memory 104 may be minimal or negligible, and so the bad bit biasing key may be stored in the non-volatile memory 104 in an unscrambled format.

Figure 11:
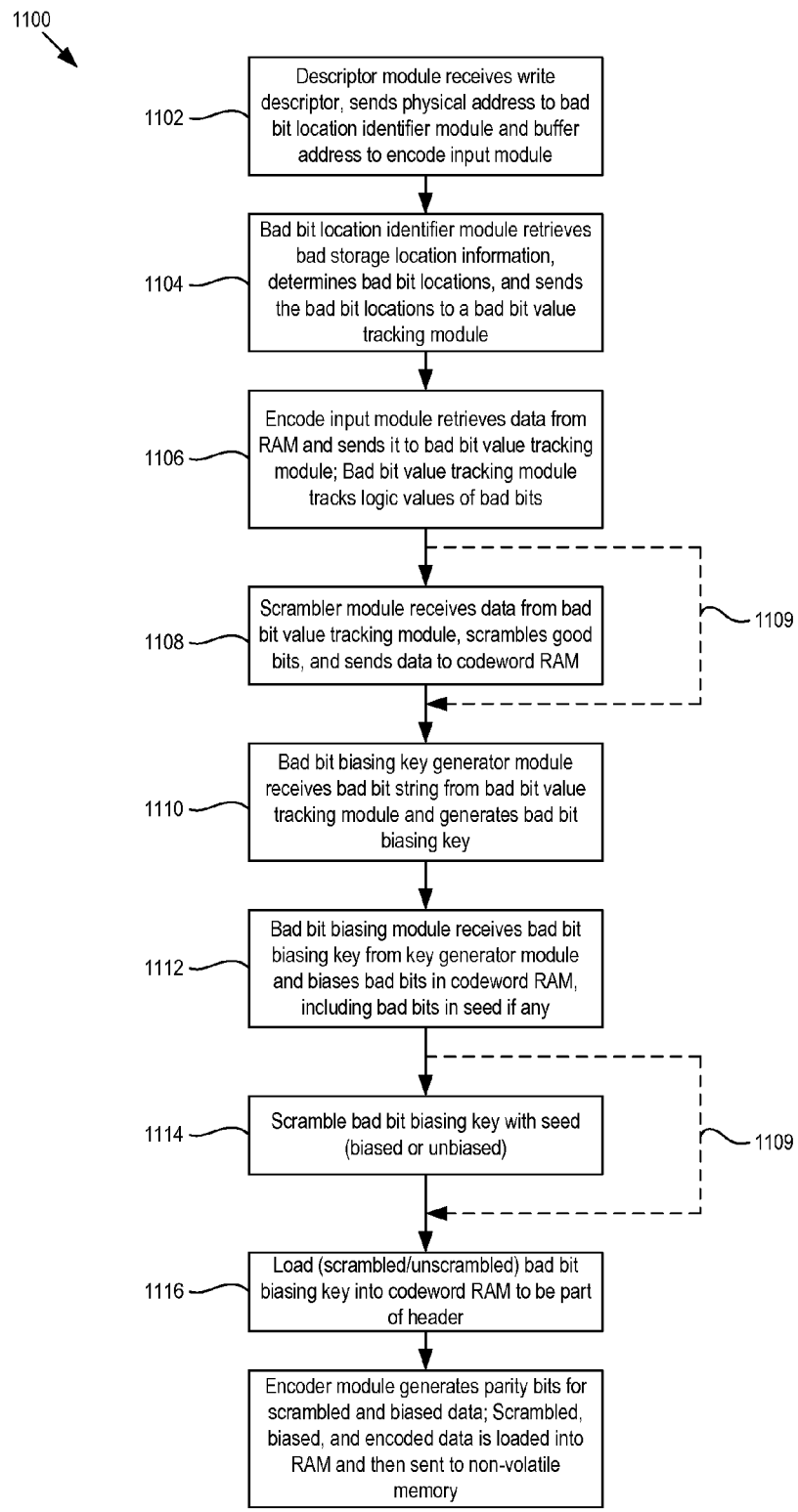
FIG. 11 is a flow chart of an example method of encoding data to be stored in non-volatile memory.

FIG. 11 shows a flow diagram of an example method 1100 of a controller encoding data for storage in non-volatile memory. Although not limited, the method 1100 may be part of a write operation performed by a non-volatile memory system in response to a host write request. As block 1102, a descriptor module may receive a descriptor indicating for the data to be encoded. The descriptor module may send physical address information where the data is to be stored in the non-volatile memory to a bad bit location identifier module and buffer address information where the data is being temporarily stored in RAM to an encode input module. At block 1104, the bad bit location identifier module may retrieve bad storage location information from a database and determine which bits of the data are to be stored in bad memory elements in the non-volatile memory. The bad bit location identifier module may send the bad storage location information to a bad bit value tracking module.

At block 1106, the encode input module may retrieve the data from RAM and send the data to the bad bit value tracking module. The bad bit value tracking module may track the logic values of the bad bits of the data. Also, as previously described, if a seed is used to scramble the data and includes bad bits, the seed may be sent to the bad bit tracking module to record the logic values of the bad bits. At block 1108, a scrambler module may receive the data from the bad bit value tracking module, scramble the good bits without scrambling the bad bits, and send the scrambled good bits and unscrambled bad bits to a codeword RAM. The scrambler module may use scrambler keys generated using a randomly generated seed, as previously described. In addition or alternatively, scrambling may be performed by an encryption engine on at least the payload portion of the data prior to being sent through the bad bit tracking module. For some methods, scrambling may be performed with the scrambler module after the data is passed through the bad bit value tracking module on header portions of the data, but not on the payload portions. For other methods, scrambling both the payload and the header portions after the data is passed through the bad bit value tracking module may be bypassed altogether, as denoted by dotted line 1109 in FIG. 11.

At block 1110, a bad bit biasing key generator module may receive a string of bad bit values from the bad bit value tracking module. Based on the logic values in the string, the bad bit biasing key generator may generate a bad bit biasing key. As previously described, the bad bit biasing key may be generated in order to bias as many bad bits associated with the string as possible to a predetermined logic value. The predetermined logic value may be identified as being the logic value that is likely to be returned by bad memory elements. At block 1112, a bad bit biasing module may receive the bad bit biasing key from the bad bit biasing key generator module and use the key to bias the bad bits stored in the codeword RAM to the predetermined logic value, such as by performing a read modify write operation. If the seed used to scramble the data also included bad bits, then these bad bits will also have been biased such that the header includes a biased version of the seed.

At block 1114, the bad bit biasing key may be scrambled to avoid patterns of bad bit biasing keys stored in the non-volatile memory. Scrambling the bad bit biasing key may be optional, as previously described and denoted by dotted arrow 1115. At block 1116, the bad bit biasing key (scrambled or unscrambled) may be loaded into the codeword RAM to be part of the header. At block 1118, an encoder module may generate parity bits for the data loaded in the codeword RAM. The parity bits may be added to the data to form an encoded version of the data. The encoded data may be loaded into RAM, and then transferred with a memory interface to the non-volatile memory for storage.

Figure 12:
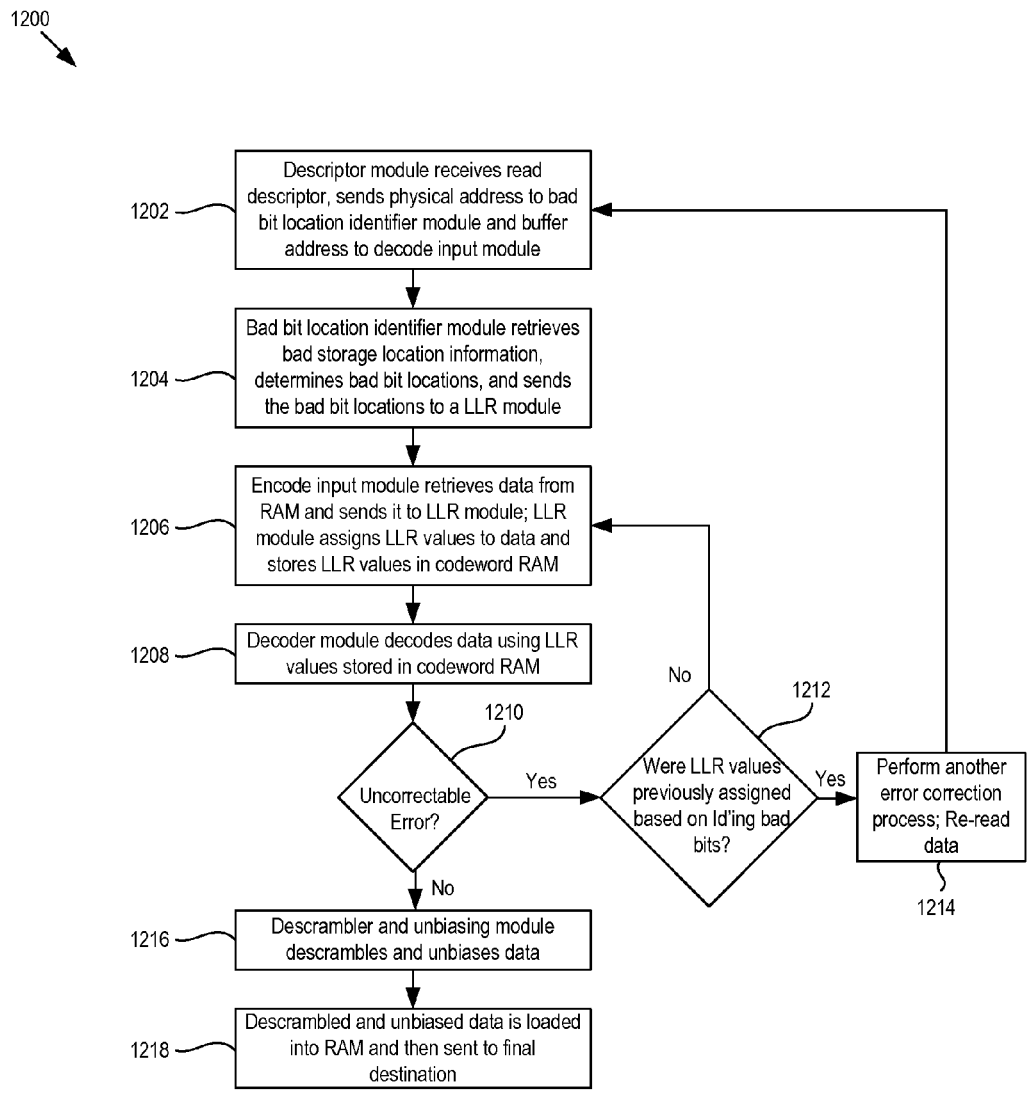
FIG. 12 is a flow chart of an example method of decoding data to be stored in non-volatile memory.

FIG. 12 shows a flow diagram of an example method 1200 of a controller decoding data retrieved from storage in non-volatile memory. Although not limited, the method 1200 may be part of a read operation performed by a non-volatile memory system in response to a host read request. As block 1202, a descriptor module may receive a descriptor indicating for the data to be decoded. The descriptor module may send physical address information where the data is stored in the non-volatile memory to a bad bit location identifier module and buffer address information where the data is stored in RAM to an decode input module. At block 1204, the bad bit location identifier module may retrieve bad storage location information from a database and determine which bits of the data are stored in bad memory elements in the non-volatile memory. The bad bit location identifier module may send the bad storage location information to a LLR module.

At block 1206, the decode input module may retrieve the data from RAM and send the data to the LLR module. The data may be sent to the LLR module as one-bit, two-bit, or three-bit representations of the data stored in the non-volatile memory. The LLR module may assign an LLR value for each of the associated bits. As previously described, the LLR module may determine, for each n-bit representation, whether the associated bit is stored in a good or a bad memory element. If the bit is stored in a good memory element, then the LLR module may access a good bit LLR table and assign a LLR value based on the logic value(s) of the n-bit representation. In addition, for methods that implement locking bits, a locking bit may be set to a value that unlocks the LLR value. Alternatively, if the bit is stored in a bad memory element, then the LLR module may assign a LLR value that corresponds to a percent likelihood that a bad bit biasing module biased the bit to a predetermined logic value using a bad bit biasing key. The LLR module may also set a sign bit of the LLR value to indicate the predetermined logic value. Additionally, for methods that implement locking bits, if the percent likelihood is 100%, then the LLR module may set the locking bit to a value that locks the LLR value. Alternatively, if the percent likelihood is less than 100%, then the LLR module may set the locking bit to a value that unlocks the LLR value. The LLR module may then load the LLR values for the data into the codeword RAM.

At block 1208, after LLR values are loaded into the codeword RAM, a decoder module may perform decoding to determine if the sign bits of the LLR values for the header and payload portions are correct and if not, correct any errors. As previously described, the decoder module may do so by using the LLR values to solve polynomial equations to achieve convergence. If the decoder module identifies errors but is unable to correct them (e.g., the number of errors exceeds a threshold number), then the decoder module may identify an uncorrectable read error event. As previously described, the LLR module may distinguish between good bits and bad bits only after an uncorrectable read error event has been detected by the decoder module. Until an uncorrectable read error event is detected, the LLR module may assign LLR values under the assumption that the n-bit representations are all associated with good bits. Accordingly, if an uncorrectable read error event is detected at block 1210, then at block 1212, if the LLR module had not previously assigned LLRs value based on distinguishing between good bits and bad bits, the method 1200 may proceed back to block 1206, where the data is passed back through the LLR module and the LLR module may assign LLR values for bad bits to correspond to the percent likelihood values. Alternatively, if at block 1212 the LLR module has already assigned LLR values based on distinguishing between good bits and bad bits, then at block 1214, a different read error recovery mechanism or scheme may be employed, such as increasing threshold voltage levels of voltages applied to the memory elements to read the data as an example, in order to attempt to reduce the number of errors in the read data. The method 1200 may then proceed back to block 1202, where the decoding process may be repeated using the re-read data.

Referring back to block 1210, if an uncorrectable read error event is not detected, convergence has been reached and the method may proceed to block 1216. At block 1216, a descrambler and unbiasing module may descramble and unbias the data. As previously described, if the bad bit biasing key was scrambled using the seed during the encoding process, then the seed, in the form in which it was stored in the non-volatile memory, either bias or unbiased, may be used to descramble the seed. In addition, if the seed included bad bits, then the descrambled bad bit biasing key may be used to unbias the biased seed. One or both of these initial descrambling and unbiasing portions of the descrambling and unbiasing process at block 1216 may be bypassed, depending on whether the bad bit biasing key is stored in the non-volatile memory in scrambled or unscrambled form, whether the seed is stored in the non-volatile memory in biased or unbiased form, and/or whether a seed was even stored in the non-volatile memory. When the bad bit biasing key is in its unscrambled form, and the seed (if stored) is in its unbiased form, then the bad bit biasing key and the unbiased seed may be used to descramble and unbias the remaining portions of the header and payload portions of the data.

At block 1218, after the data is descrambled and unbiased, the data may be loaded into RAM and thereafter sent to its final destination. For example, if the decoding process is performed in response to a host read request, the data may be sent to the host.

Lastly, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A non-volatile memory system comprising:
    non-volatile memory;
    a controller configured to:
        identify a plurality of memory elements of the non-volatile memory to store data;
        determine which memory elements of the plurality of memory elements are identified in the non-volatile memory system as unreliable;
        bias bits of the data to be stored in the identified unreliable memory elements to a predetermined logic value using a biasing key; and
        assign bit values for the biasing key in order for the biasing module to bias, using the biasing key, more than 50% of the bits to be stored in the identified unreliable memory elements to the predetermined logic value.

2. The non-volatile memory system of claim 1, wherein the controller is further configured to:
    group the bits into a plurality of bit groups, each bit group corresponding to a bit of the biasing key;
    select logic values from the plurality of bit groups; and
    assign the bit values for the biasing key based on the selected logic values from the plurality of bit groups.

3. The non-volatile memory system of claim 2, wherein the controller is configured to select the logic values from the plurality of bit groups based on a majority rule basis.

4. The non-volatile memory system of claim 2, wherein the controller is configured to group no more than a predetermined maximum number of bits into each of the plurality of bit groups.

5. The non-volatile memory system of claim 4, wherein the predetermined maximum number is three.

6. The non-volatile memory system of claim 2, further comprising wherein the controller is further:
    configured to record logic values of the bits to be stored in the identified unreliable memory elements, and
    select the logic values from the plurality of bit groups to assign the bit values for the biasing key based on the recorded logic values of the bits.

7. The non-volatile memory system of claim 2, wherein at least one of the plurality of bit groups comprises a multi-bit bit group when a number of the bits to be stored in the identified unreliable memory elements is greater than a maximum length of the biasing key.

8. The non-volatile memory system of claim 7, wherein the controller is configured to generate a reduced-length string of logic values based on the bits in order to generate the biasing key when the number of the bits is greater than the maximum length of the biasing key.

9. The non-volatile memory system of claim 1, wherein the bits comprises first bits, and wherein the controller is further:
    configured to:
        receive the data; and
        scramble second bits of the data to be stored in memory elements of the plurality of memory elements identified as reliable without scrambling the first bits to be stored in the identified unreliable memory elements.

10. The non-volatile memory system of claim 1, wherein the non-volatile memory system comprises a card based system.

11. The non-volatile memory system of claim 1, wherein the non-volatile memory system comprises a solid state drive.

12. The non-volatile memory system of claim 1, wherein the non-volatile memory system comprises a hierarchical storage system.

13. A method of generating encoded data to be stored in non-volatile memory of a non-volatile memory system, the method comprising:
    scrambling, with a controller, a first set of bits of data to be stored in first memory elements of non-volatile memory, the first memory elements identified in the non-volatile memory system as reliable;
    biasing, with the controller, a second set of bits of the data to be stored in second memory elements of the non-volatile memory to a predetermined logic value, the second memory elements identified in the non-volatile memory system as unreliable;
    generating, with the controller, parity bits for the scrambled first set of bits and the biased second set of bits to form the encoded data; and
    transferring, with the controller, the encoded data to the non-volatile memory for storage.

14. The method of claim 13, wherein biasing the second set of bits of the data comprises biasing, with the biasing module using the biasing key, more than 50% of the second set of bits to the predetermined logic value.

15. The method of claim 13, further comprising:
    grouping, with the controller, the second set of bits into a plurality of bit groups, each bit group corresponding to a bit of the biasing key;
    selecting, with the controller, logic values from the plurality of bit groups; and
    assigning, with the controller, bit values for the biasing key based on the selected logic values from the plurality of bit groups.

16. The method of claim 15, wherein selecting the logic values comprises selecting, with the controller, the logic values from the plurality of bit groups based on a majority rule basis.

17. The method of claim 13, wherein scrambling the first set of bits of data comprises scrambling the first set of bits with the controller based on a randomly generated seed.

18. The method of claim 17, wherein the second set of bits comprises one or more bits of the seed, and wherein biasing the second set of bits comprises biasing, with the controller using the biasing key, the one or more bits of the seed.

19. The method of claim 13, further comprising:
    transferring, with the controller, the biasing key as part of the encoded data to the non-volatile memory.

20. The method of claim 19, further comprising:
    scrambling, with the controller, the biasing key,
    wherein transferring the biasing key comprises transferring a scrambled version of the biasing key as part of the encoded data to the non-volatile memory.

21. A non-volatile memory system comprising:
    non-volatile memory;
    means for identifying a plurality of memory elements of the non-volatile memory to store data;

means for determining which memory elements of the plurality of memory elements are identified in the non-volatile memory system as unreliable;

means for biasing bits of the data to be stored in the identified unreliable memory elements to a predetermined logic value using a biasing key; and means for assigning bit values for the biasing key in order for the biasing module to bias, using the biasing key, more than 50% of the bits to be stored in the identified unreliable memory elements to the predetermined logic value.

22. The non-volatile memory system of claim 21, further comprising:

means for grouping the bits into a plurality of bit groups, each bit group corresponding to a bit of the biasing key;

means for selecting logic values from the plurality of bit groups; and means for assigning the bit values for the biasing key based on the selected logic values from the plurality of bit groups.

23. The non-volatile memory system of claim 22, wherein the means for selecting the logic values from the plurality of bit groups comprises means for selecting the logic values from the plurality of bit groups based on a majority rule basis.

24. The non-volatile memory system of claim 22, wherein the means for grouping comprises means for grouping no more than a predetermined maximum number of bits into each of the plurality of bit groups.

25. The non-volatile memory system of claim 22, further comprising:

means for recording logic values of the bits to be stored in the identified unreliable memory elements, wherein the means for selecting the logic values from the plurality of bit groups comprises means for selecting the logic values from the plurality of bit groups in order to assign the bit values for the biasing key based on the recorded logic values of the bits.

26. The non-volatile memory system of claim 22, wherein at least one of the plurality of bit groups comprises a multi-bit bit group when a number of the bits to be stored in the identified unreliable memory elements is greater than a maximum length of the biasing key.

27. The non-volatile memory system of claim 21, wherein the bits comprises first bits, further comprising:

means for receiving the data; and means for scrambling second bits of the data to be stored in memory elements of the plurality of memory elements identified as reliable without scrambling the first bits to be stored in the identified unreliable memory elements.

* * * * *